US010775440B2

(12) United States Patent
Abu Qahouq

(10) Patent No.: US 10,775,440 B2
(45) Date of Patent: Sep. 15, 2020

(54) METHODS, APPARATUSES, AND SYSTEMS FOR MEASURING IMPEDANCE SPECTRUM, POWER SPECTRUM, OR SPECTRAL DENSITY USING FREQUENCY COMPONENT ANALYSIS OF POWER CONVERTER VOLTAGE AND CURRENT RIPPLES

(71) Applicant: The Board of Trustees of the University of Alabama, Tuscaloosa, AL (US)

(72) Inventor: Jaber A. Abu Qahouq, Tuscaloosa, AL (US)

(73) Assignee: The Board of Trustees of the University of Alabama, Tuscaloosa, AL (US)

( * ) Notice: Subject to any disclaimer, the term of this patent is extended or adjusted under 35 U.S.C. 154(b) by 98 days.

(21) Appl. No.: 15/687,885

(22) Filed: Aug. 28, 2017

(65) Prior Publication Data

US 2018/0059191 A1 Mar. 1, 2018

Related U.S. Application Data

(60) Provisional application No. 62/380,457, filed on Aug. 28, 2016.

(51) Int. Cl.
*G01R 31/36* (2020.01)
*G01R 31/389* (2019.01)
(Continued)

(52) U.S. Cl.
CPC ......... *G01R 31/389* (2019.01); *G01R 31/392* (2019.01); *G01R 23/16* (2013.01)

(58) Field of Classification Search
CPC .............................. G01R 31/389; G01R 31/392
See application file for complete search history.

(56) References Cited

U.S. PATENT DOCUMENTS 8,035,396 B2 * 10/2011 Kim .................... G01R 31/385
324/430
9,368,991 B2 6/2016 Qahouq
(Continued)

FOREIGN PATENT DOCUMENTS

WO WO-9322666 A1 * 11/1993 ........... G01R 31/389

OTHER PUBLICATIONS

Huang, W. et al., "An Online Battery Impedance Measurement Method Using DC-DC Power Converter Control," IEEE Transactions on Industrial Electronics, vol. 61, No. 11, Nov. 2014.

*Primary Examiner* — Walter L Lindsay, Jr.
*Assistant Examiner* — Milton Gonzalez
(74) *Attorney, Agent, or Firm* — Meunier Carlin & Curfman LLC

(57) ABSTRACT

Methods, apparatuses, and systems for measuring impedance spectrum, power or energy density, and/or spectral density using frequency component analysis of power converter voltage and current ripple are described herein. An example method for measuring impedance spectrum, power spectrum, or spectral density can include measuring an alternating current (AC) ripple associated with a power converter, where the AC ripple includes an AC current ripple and an AC voltage ripple. The method can also include performing a frequency analysis to obtain respective frequency components of the AC current ripple and the AC voltage ripple, and calculating an impedance spectrum, a power spectrum, or a spectral density of an electrical component based on the respective frequency components of the AC current ripple and the AC voltage ripple.

18 Claims, 14 Drawing Sheets

(51) Int. Cl.
*G01R 31/392* (2019.01)
*G01R 23/16* (2006.01)

(56) References Cited

U.S. PATENT DOCUMENTS

| | | | |
|---|---|---|---|
| 2003/0066555 A1* | 4/2003 | Hui | H01L 31/02021 136/246 |
| 2013/0229156 A1* | 9/2013 | Brandon | B60L 3/0046 320/136 |
| 2014/0125284 A1* | 5/2014 | Qahouq | H02J 7/0065 320/118 |
| 2014/0320094 A1* | 10/2014 | Huang | H02M 3/156 323/235 |

* cited by examiner

METHODS, APPARATUSES, AND SYSTEMS FOR MEASURING IMPEDANCE SPECTRUM, POWER SPECTRUM, OR SPECTRAL DENSITY USING FREQUENCY COMPONENT ANALYSIS OF POWER CONVERTER VOLTAGE AND CURRENT RIPPLES

CROSS-REFERENCE TO RELATED APPLICATIONS

This application claims the benefit of U.S. Provisional Patent Application No. 62/380,457, filed on Aug. 28, 2016, entitled "METHODS, APPARATUSES, AND SYSTEMS FOR MEASURING IMPEDANCE SPECTRUM, POWER SPECTRUM, OR SPECTRAL DENSITY USING FREQUENCY COMPONENT ANALYSIS OF POWER CONVERTER VOLTAGE AND CURRENT RIPPLES," the disclosure of which is expressly incorporated herein by reference in its entirety.

BACKGROUND

The knowledge of source, load, and component AC impedance is important in many applications. For example, in the case of a battery (or other source such as a solar cell, fuel cell, etc.), the knowledge of the battery's Electrochemical AC/Complex Impedance Spectrum (EIS) is important because it gives information on the health of the battery such as state of health (SOH) and other characteristics such as state of charge (SOC). Measuring the EIS such as in the battery case, however, usually requires equipment and is done off-line if interrupting the load operation is not feasible. Thus, it is desired to measure EIS online and in real-time and doing so has many benefits and applications.

SUMMARY

Methods, apparatuses, and systems for measuring impedance spectrum using frequency component analysis of power converter voltage and current ripples are described herein. Methods, apparatuses, and systems for measuring power spectrum or spectral density using frequency component analysis of power converter voltage and current ripples are also described herein.

An example method for measuring impedance spectrum, power spectrum, or spectral density can include measuring an alternating current (AC) ripple associated with a power converter, where the AC ripple includes an AC current ripple and an AC voltage ripple. The method can also include performing a frequency analysis to obtain respective frequency components of the AC current ripple and the AC voltage ripple, and calculating an impedance spectrum, a power spectrum, or a spectral density of an electrical component based on the respective frequency components of the AC current ripple and the AC voltage ripple.

Additionally, the impedance spectrum, the power spectrum, or the spectral density can include values at a plurality of frequencies. In some implementations, the plurality of frequencies can include frequencies equal to or greater than a switching ripple frequency of the power converter (e.g., a plurality of harmonic frequencies greater than the switching ripple frequency).

Alternatively or additionally, the impedance spectrum, the power spectrum, or the spectral density can be calculated using measurements of the AC ripple obtained over a single switching ripple cycle of the power converter. Alternatively, the impedance spectrum, the power spectrum, or the spectral density can optionally be calculated using measurements of the AC ripple obtained over a plurality of switching ripple cycles of the power converter.

Alternatively or additionally, the impedance spectrum, the power spectrum, or the spectral density can be calculated while the power converter is online delivering power to a load.

Alternatively or additionally, performing the frequency analysis can include using a Discrete Fourier Transform (DFT) or the Fast Fourier Transform (FFT), for example.

Alternatively or additionally, measuring the AC ripple can include measuring voltage and current associated with the electrical component. Optionally, the electrical component can be a power source or load. The power source or load can be, but is not limited to, a battery, a solar cell or panel, a fuel cell, a supercapacitor, a motor, a generator, an antenna, a wireless power coil, or a piezoelectric energy harvester. Alternatively, the electrical component can be a component of the power converter such as an inductor, capacitor, transistor, diode, or transformer.

In some implementations, a plurality of electrical components can be connected in series and/or in parallel. In these implementations, measuring the AC ripple can include measuring respective voltages and currents associated with each of the electrical components. In addition, the method can further include calculating a respective impedance spectrum, power spectrum, or spectral density of each of the electrical components.

Alternatively or additionally, the method can further include varying a switching frequency of the power converter. In addition, the impedance spectrum, the power spectrum, or the spectral density can be calculated based on respective frequency components of the AC current ripple and the AC voltage ripple at a first switching frequency and respective frequency components of the AC current ripple and the AC voltage ripple at a second switching frequency.

Alternatively or additionally, the method can further include applying a step-function perturbation configured to increase an output voltage or current of the power converter, measuring voltage and current associated with the electrical component in response to the step-function perturbation, and performing a frequency analysis to obtain respective frequency components of the response voltage and current associated with the electrical component. In addition, the impedance spectrum, the power spectrum, or the spectral density can be calculated based on the respective frequency components of the response voltage and current associated with the electrical component. The step-function perturbation can be performed at a fundamental frequency less than the switching frequency of the power converter. For example, this perturbation can be performed at less than one-half the switching frequency of the power converter or at a frequency 10 or more times less than the switching frequency of the power converter. By performing the frequency analysis, frequency components are obtained at the fundamental frequency of the step-function perturbation and a plurality of frequencies greater than the fundamental frequency. Thus, it is possible to obtain the impedance spectrum, the power spectrum, or the spectral density including values at the fundamental frequency of the step-function perturbation and its harmonic frequencies. This includes values of the impedance spectrum, the power spectrum, or the spectral density at frequencies less than the switching frequency of the power converter.

Alternatively or additionally, the method can include applying a duty cycle perturbation to the power converter, which causes a change in the voltage and current responses. In addition, the impedance spectrum, the power spectrum, or the spectral density can include values at a plurality of frequencies equal to or less than a switching ripple frequency of the power converter. According to this implementation, the impedance spectrum, the power spectrum, or the spectral density can be calculated using measurements of the AC ripple obtained over a plurality of switching ripple cycles of the power converter. The duty cycle perturbation can be performed at a fundamental frequency less than the switching frequency of the power converter. For example, this perturbation can be performed at less than one-half the switching frequency of the power converter or at a frequency 10 or more times less than the switching frequency of the power converter. By performing the frequency analysis, frequency components are obtained at the fundamental frequency of the duty cycle perturbation and a plurality of frequencies greater than the fundamental frequency. Thus, it is possible to obtain the impedance spectrum, the power spectrum, or the spectral density including values at the fundamental frequency of the duty cycle perturbation and its harmonic frequencies. This includes values of the impedance spectrum, the power spectrum, or the spectral density at frequencies less than the switching frequency of the power converter.

Alternatively or additionally, the method can include cancelling the effect of the step-function perturbation or the duty cycle perturbation on the resulted step ripple at the output of the power converter by controlling the power converter simultaneously with one or more other power converters.

Alternatively or additionally, the method can include using the impedance spectrum, the power spectrum, or the spectral density to obtain a state of health (SOH) or state of charge (SOC) of the electrical component.

Alternatively or additionally, the method can include controlling the power converter based on the impedance spectrum, the power spectrum, or the spectral density. For example, controlling the power converter can include at least one of adjusting a frequency, duty cycle, output voltage, or output current; performing fault detection; maximizing efficiency or power transfer; or performing maximum power point tracking. In some implementations, performing fault detection can further include detecting a fault in the electrical component based on a rate of change of the impedance spectrum, the power spectrum, or the spectral density. In response to detecting the fault, the method can further include isolating the electrical component or providing an alarm.

Alternatively or additionally, the AC ripple can be a triangular or non-triangular waveform.

An example apparatus for measuring impedance spectrum, power spectrum, or spectral density is also described herein. The apparatus can include a current sensor configured for measuring current flowing through an electrical component, and a voltage sensor configured for measuring voltage across the electrical component. The measured current and voltage can include an alternating current (AC) ripple associated with a power converter, and the AC ripple can include an AC current ripple and an AC voltage ripple. The apparatus can also include a controller operably coupled to the current sensor and the voltage sensor. The controller can include a processing unit and a memory operably coupled to the processing unit, and the controller can be configured to measure impedance spectrum, power spectrum, or spectral density of the electrical component. For example, the controller can be configured to receive and sample the current and voltage measured by the current and voltage sensors, perform a frequency analysis on the sampled current and voltage to obtain respective frequency components of the AC current ripple and the AC voltage ripple, and calculate an impedance spectrum, a power spectrum, or a spectral density of the electrical component based on the respective frequency components of the AC current ripple and the AC voltage ripple. It should be understood that the controller can be configured to measure impedance spectrum, power spectrum, or spectral density according to any of the techniques described herein.

In some implementations, the electrical component can be a power source or load. Alternatively or additionally, the electrical component can be a component of the power converter. Optionally, the apparatus can further include a power converter controller operably connected to the controller.

An example system for measuring impedance spectrum, power spectrum, or spectral density is also described herein. The system can include a power converter electrically connected between a power source and a load, an electrical component operably connected with the power converter, a current sensor configured for measuring current flowing through the electrical component, and a voltage sensor configured for measuring voltage across the electrical component. The measured current and voltage can include an alternating current (AC) ripple associated with a power converter, and the AC ripple can include an AC current ripple and an AC voltage ripple. The system can also include a controller operably coupled to the current sensor and the voltage sensor. The controller can include a processing unit and a memory operably coupled to the processing unit, and the controller can be configured to measure impedance spectrum, power spectrum, or spectral density of the electrical component. For example, the controller can be configured to receive and sample the current and voltage measured by the current and voltage sensors, perform a frequency analysis on the sampled current and voltage to obtain respective frequency components of the AC current ripple and the AC voltage ripple, and calculate an impedance spectrum, a power spectrum, or a spectral density of the electrical component based on the respective frequency components of the AC current ripple and the AC voltage ripple. It should be understood that the controller can be configured to measure impedance spectrum, power spectrum, or spectral density according to any of the techniques described herein.

In some implementations, the system can include a plurality of electrical components, which can be connected to the power converter in series or in parallel. Additionally, the current sensor and the voltage sensor can be configured to measure respective voltages and currents associated with each of the electrical components, and the controller can be configured to calculate a respective impedance spectrum, power spectrum, or spectral density of each of the electrical components. Alternatively or additionally, the system can optionally further include a power converter controller operably connected to the controller.

It should also be understood that the above-described subject matter may also be implemented as a computer-controlled apparatus, a computer process, a computing system, or an article of manufacture, such as a computer-readable storage medium.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. While implementations will be described for measuring impedance spectrum of a battery using frequency component analysis of power converter voltage and current ripple, it will become evident to those skilled in the art that the implementations are not limited thereto, but are applicable for measuring other information using frequency component analysis of power converter voltage and current ripple including, but not limited to, measuring a complex power spectrum, a power spectral density, and/or an energy spectral density.

Figure 1:
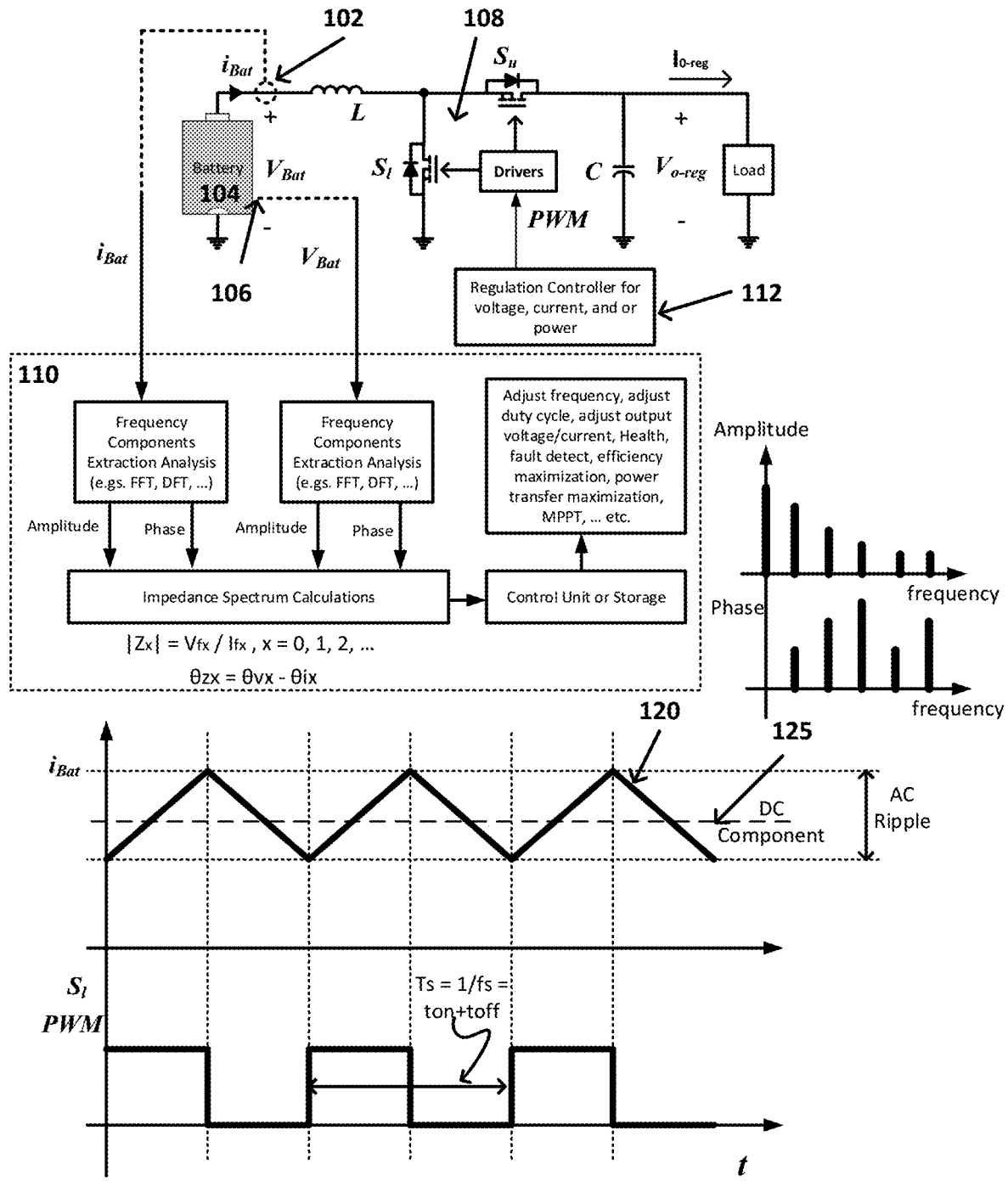
FIG. 1 illustrates an example apparatus for measuring electrochemical impedance spectrum (EIS) of a battery using frequency component analysis of power converter voltage and current ripple.

Referring now to FIG. 1, an example apparatus for measuring electrochemical impedance spectrum (EIS) of a battery using frequency component analysis of power converter voltage and current ripple is shown. As described herein, the apparatus can optionally be used for measuring the impedance spectrum of other electrical components including, but not limited to, a battery, a solar cell or panel, a fuel cell, a supercapacitor, a motor, a generator, an antenna, a wireless power coil, a piezoelectric energy harvester, an inductor, capacitor, transistor, diode, transformer, or other electrical component. In addition, this disclosure contemplates that the apparatus can optionally be used for measuring the complex power spectrum, the power spectral density, or the energy spectral density of an electrical component.

The apparatus includes a current sensor 102 configured for measuring current flowing through an electrical component 104. The current sensor 102 can be any type of current sensor known in the art such as an ammeter, current probe, sense resistor based current sensor, Hall effect based current sensor, transformer based current sensor, or inductive based current sensor. The current sensor 102 is configured for measuring direct current (DC) and/or alternating current (AC) currents. Current sensors are known in the art and are therefore not described in further detail herein. In FIG. 1, the electrical component 104 is a battery. It should be understood that a battery is provided only as an example and that the electrical component can be something other than a battery. The apparatus also includes a voltage sensor 106 for measuring voltage across the electrical component 104. The voltage sensor 106 can be any type of voltage sensor known in the art such as a voltmeter, voltage probe, transformer based voltage sensor, or resistive network based voltage sensor. The voltage sensor 106 is configured for measuring DC and/or AC voltages. Voltage sensors are known in the art and are therefore not described in further detail herein.

As described below, the apparatus can be used to measure the IS of the electrical component 104 (i.e., EIS of a battery in FIG. 1). For example, the current sensor 102 and the voltage sensor 106 are used to measure an AC ripple or AC switching ripple, which includes both an AC current ripple and an AC voltage ripple, associated with a power converter 108. The power converter 108 maintains/regulates the DC value of the output voltage ($V_{o\text{-}reg}$), the load current ($I_{o\text{-}reg}$), load power, or any variable that needs regulation. In FIG. 1, the power converter 108 is a bidirectional DC-DC boost/buck power converter. This disclosure contemplates that the methods, apparatuses, and systems described herein can be implemented using a power converter other than the boost/buck power converter shown in FIG. 1, which is provided only as an example. Additionally, while DC-DC power converters are used to illustrate the techniques described herein, it should be understood that other types of circuits and converters can also be used including, but not limited to, DC-AC inverter circuits, DC-AC converter circuits, and AC-AC converter circuits.

Figure 2:
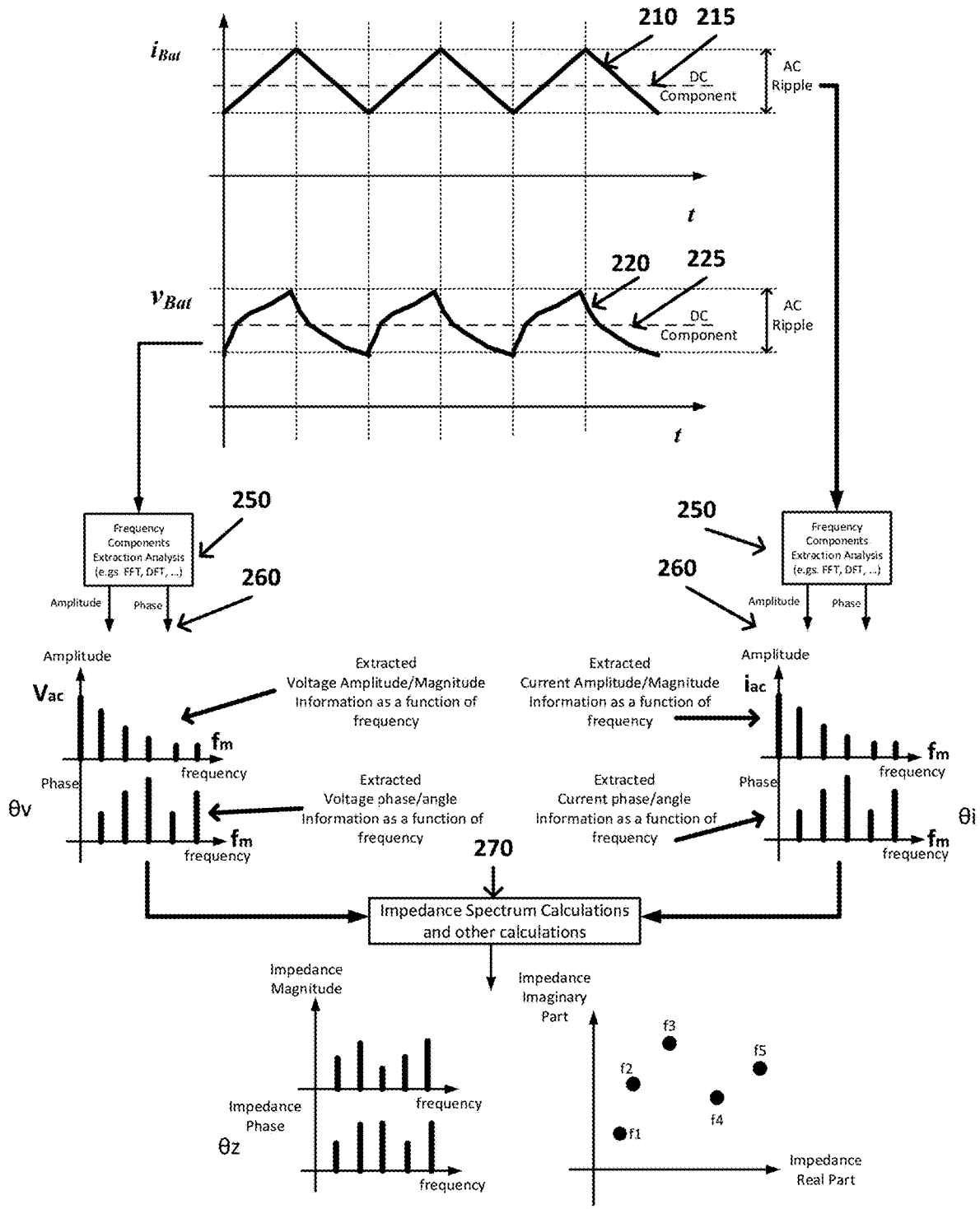
FIG. 2 includes graphs illustrating example AC current ripple imposed on the DC value of current passing through a battery and example AC voltage ripple imposed on the DC value of voltage across the battery, as well as example operations for measuring the impedance spectrum of a battery (i.e., the EIS of the battery).

The naturally existing switching ripple (e.g., the AC ripple) of the power converter 108 is measured at the electrical component 104 (e.g., by measuring $i_{Bat}$, $V_{Bat}$ in FIG. 1). In other words, the measured current and voltage (e.g., $i_{Bat}$, $V_{Bat}$ in FIG. 1) reflect the AC ripple associated with the power converter 108 (e.g., as a result of switching ON and OFF the transistors of the power converter). An example of the AC current ripple 120 imposed on the DC value 125 of current passing through the electrical component 104 is shown in FIG. 1. This AC current ripple 120 has an ideal triangular waveform shape and is provided as an example only. It should be understood that other types of power converters with different types of switching control methods may result in AC ripple having other waveforms shapes and nature. This disclosure therefore contemplates that AC ripple can have a triangular or non-triangular waveform shapes (e.g., a shape that is semi square wave, semi sinusoidal, or semi saw tooth). Additionally, example AC current ripple 210 imposed on the DC value 215 of current passing through a battery and example AC voltage ripple 220 imposed on the DC value 225 of voltage across the battery are shown in FIG. 2.

Referring again to FIG. 1, as switches of the power converter 108 turn ON and OFF, a switching ripple (i.e., AC ripple) is imposed on the DC values of the currents and voltages of the electrical component 104 (i.e., the battery). The frequency of the switching ripple may be equal to the switching frequency ($f_s$), for example, as is the case of the power converter 108 shown in FIG. 1. This disclosure contemplates, however, that the frequency of the switching ripple can be equal to a fraction (e.g., ½) or multiple (e.g., double) of the switching frequency of the power converter 108, for example. When the AC ripple is a non-sinusoidal waveform (e.g., AC current ripple 120 of FIG. 1, AC current ripple 210 of FIG. 2, or AC voltage ripple 220 of FIG. 2), it contains a fundamental frequency component, as well as frequency components that are at greater than the fundamental frequency (e.g., harmonic frequencies). For example, if the frequency of the AC ripple (which is equal to the switching frequency of the power converter 108 in FIG. 1) is 10 kHz, it is possible to obtain frequency components of the AC ripple at a plurality of frequencies, e.g., frequencies 10 kHz, 30 kHz, 50 kHz, 70 kHz, 90 kHz, 110 kHz, 130 kHz, . . . etc. It should be understood that 10 kHz is provided only as an example of the frequency of the AC ripple, which can be a frequency more or less than 10 kHz.

The apparatus also includes a controller 110 (e.g., a microcontroller) operably coupled to the current sensor 102 and the voltage sensor 106. The controller 110 can be operably coupled to the current sensor 102 and the voltage sensor 106 through one or more communication links. This disclosure contemplates the communication links are any suitable communication link. For example, a communication link may be implemented by any medium that facilitates data exchange between the controller 110 and the current sensor 102/voltage sensor 106 including, but not limited to, wired, wireless and optical links. The controller 110 includes a processing unit and a memory operably coupled to the processing unit (e.g., computing device 1100 of FIG. 11) and is configured to measure impedance spectrum, power spectrum, or spectral density of the electrical component 104 as described herein.

As described above, the current sensor 102 and the voltage sensor 106 are used to measure an AC ripple, which includes both an AC current ripple and an AC voltage ripple. The measured AC current ripple and AC voltage ripple is then sampled by an analog-to-digital converter (ADC). ADCs are well known in the art and therefore not described in further detail herein. For example, the AC current ripple and AC voltage ripple can be received at the controller 110, which can be configured to perform the sampling. The respective frequency components of the AC current ripple and the AC voltage ripple are then obtained by performing a frequency analysis. The frequency analysis can include using a Discrete Fourier Transform (DFT) or the Fast Fourier Transform (FFT), for example. DFT and FFT are provided only as examples of a frequency analysis, and this disclosure contemplates that other frequency analyses can be used to obtain the respective frequency components of the AC current ripple and the AC voltage ripple. An impedance spectrum (or a power spectrum, a spectral density, etc.) of the electrical component 104 can then be calculated based on the respective frequency components of the AC current ripple and the AC voltage ripple. This disclosure contemplates that the controller 110 can be configured to perform the frequency analysis and calculate the impedance spectrum, power spectrum, spectral density, etc. of the electrical component 104.

Calculating Impedance Spectrum

Referring now to FIG. 2, example operations for measuring the impedance spectrum of a battery (i.e., the EIS of the battery) are shown. When a digital controller (e.g., controller 110 of FIG. 1) is used, the voltage and current of a battery (e.g., $V_{Bat}$ and $i_{Bat}$ in FIG. 2) are sampled by an ADC at 250. As described above, the voltage and current of the battery represent the AC voltage ripple 220 and the AC current ripple 210 of a power converter (e.g., power converter 108 of FIG. 1). By applying DFT at 260, the respective frequency component amplitudes of the voltage ($V_{ac}(f_1)$, $V_{ac}(f_2)$, . . . , $V_{ac}(f_M)$) and the current ($I_{ac}(f_1)$, $I_{ac}(f_2)$, . . . , $I_{ac}(f_M)$) and the corresponding phase shift ($\theta_z(f_1)$, $\theta_z(f_2)$, . . . , $\theta_z(f_M)$) can be obtained as given by Equation (1). Example extracted voltage/current amplitudes and phases as a function of frequency are shown in FIG. 2.

$$X_k = \sum_{n=0}^{N-1} x_n \cdot e^{-j\left(\frac{2\pi k n}{N}\right)} \quad (1)$$

$$= \sum_{n=0}^{N-1} x_n \cdot \left[\cos\left(-\frac{2\pi k n}{N}\right) + j\sin\left(-\frac{2\pi k n}{N}\right)\right],$$

Where N is the number of samples in the measured and sampled signal (e.g., the measured voltage or current of the battery), n is the current sample under consideration (0, 1, . . . , N−1), $x_n$ is the value of the signal at time n, k is the frequency under consideration (0 Hz to N−1 Hz), and $X_k$ is the value of the signal at frequency k which is a complex number that includes the amplitude and phase information of the signal at at frequency k. $X_k$ provides the information of $V_{ac}(f_r)$, $I_{ac}(f_r)$, and $\theta_z(f_r)=\theta_v(f_r)-\theta_i(f_r)$ for Equation (4).

After performing the frequency analysis, Equation (2) can then be used to calculate the impedance spectrum (i.e., the EIS for the battery) for a range of frequencies at 270. The impedance spectrum includes values at a plurality of frequencies. As described above, the frequency analysis yields extracted voltage/current amplitudes and phases for a plurality of frequency components as shown in FIG. 2, and thus, the impedance spectrum will also include values (i.e., complex impedance magnitudes and phases) at a plurality of frequencies as shown in FIG. 2. For example, the impedance spectrum can include values at a fundamental frequency and harmonic frequencies related to the switching frequency of the power converter. In addition, the plurality of frequencies can include frequencies equal to or greater than a switching ripple frequency of the power converter.

The impedance spectrum can be calculated using measurements of the AC ripple obtained over a single switching ripple cycle of the power converter. This is in contrast to the single frequency impedance measurement described below with regard to FIG. 5A, which requires a plurality of switching ripple cycles to obtain the measurement at a single frequency (e.g., requires for each frequency at least one sinusoidal perturbation cycle which includes multiple switching cycles, e.g. 100 switching cycles, in order to obtain a single impedance value at a single frequency). Alternatively, the impedance spectrum can optionally be calculated using measurements of the AC ripple obtained over a plurality of switching ripple cycles of the power converter. Alternatively or additionally, the impedance spectrum can be calculated while the power converter is online delivering power to a load. It should also be understood that the impedance spectrum can be obtained without modifying control of the power converter, i.e., the power converter output current and voltage is maintained without inducing any ripple.

$$Z_{Bat}(f_r) = \frac{V_{ac}(f_r)}{I_{ac}(f_r)} e^{j\theta_z(f_r)} = X + jY, \quad (2)$$

$$X = \frac{V_{ac}(f_r)}{I_{ac}(f_r)} \cos(\theta_z(f_r)),$$

$$Y = \frac{V_{ac}(f_r)}{I_{ac}(f_r)} \sin(\theta_z(f_r)), \; j = \sqrt{-1}$$

Where=1, 2, . . . , M, and $f_M > \ldots > f_2 > f_p$. X is the real part of the impedance and Y is the imaginary part of the impedance. $f_p$ is the fundamental frequency of the switching ripple of the voltage and current.

Figure 3A:
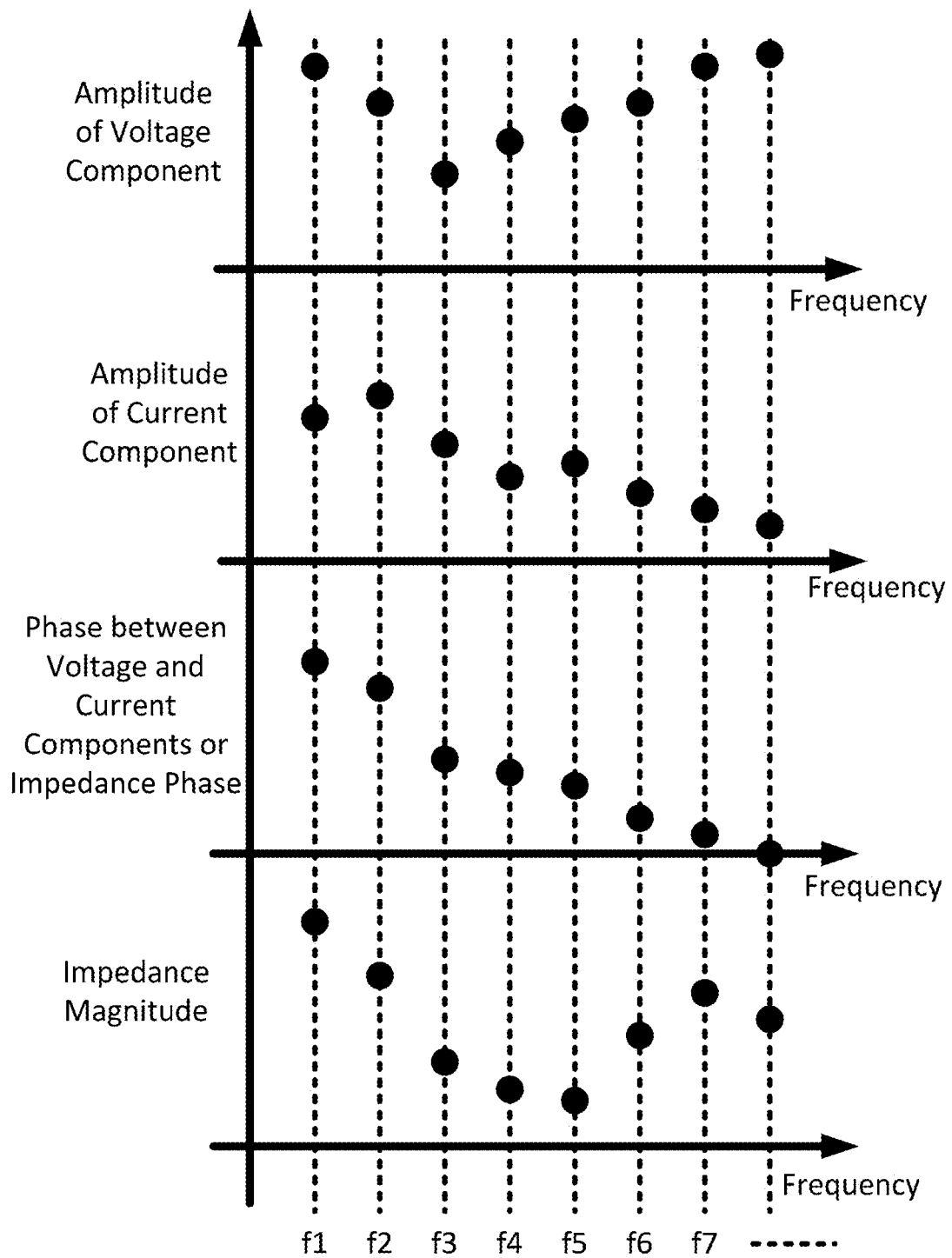
FIG. 3A includes graphs illustrating the results of an example frequency analysis, i.e., respective voltage and current amplitudes as a function of frequency and graphs illustrating the resulting impedance spectrum, i.e., the complex impedance as a function of frequency, calculated using the results of the frequency analysis.
Figure 3B:
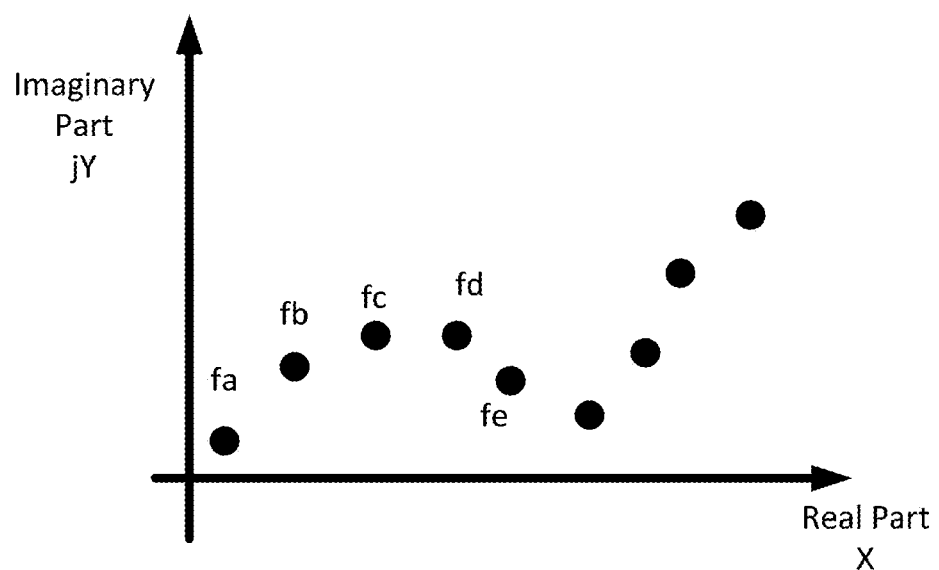
FIG. 3B is a graph illustrating an example impedance spectrum in a real part versus imaginary part plot.

FIG. 3A includes graphs illustrating the results of an example frequency analysis, i.e., respective voltage and current amplitudes as a function of frequency. FIG. 3A also includes graphs illustrating the resulting impedance spectrum, i.e., the complex impedance as a function of frequency, calculated using the results of the frequency analysis. It should be understood that the graphs in FIG. 3A are not to scale and are provided for illustration only. FIG. 3B is a graph illustrating an example impedance spectrum in a real part versus imaginary part plot.

Calculating Power Spectrum or Spectral Density

Similarly to the impedance spectrum calculations described above, Equations (3)-(6) can be used to calculate the power spectrum, the energy spectral density, and/or the power spectral density for a range of frequencies. In some implementations, complex power at each respective frequency can be obtained by multiplying the voltage component by the current component at each respective frequency, for example, as shown by Equation (3). In other implementations, a Complex Power Spectroscopy (CPD) can be obtained by performing a frequency analysis such as DFT as shown in Equation (4). The Energy Spectral Density (ESD) can be obtained as shown in Equation (5), and the Power Spectral Density (PSD) can be obtained as shown in Equation (6).

Each of the CPD, ESD, and PSD includes values at a plurality of frequencies. As described above, the frequency analysis yields extracted voltage/current amplitudes and phases for a plurality of frequency components as shown in FIG. 2, and thus, each of the CPD, ESD, and PSD will also include values at a plurality of frequencies. For example, each of the CPD, ESD, and PSD can include values at a fundamental frequency and harmonic frequencies related to the switching frequency of the power converter. Additionally, Equations (3)-(6) yield the CPD, ESD, and PSD at frequencies equal to or greater than a switching ripple frequency of the power converter.

Figure 5A:
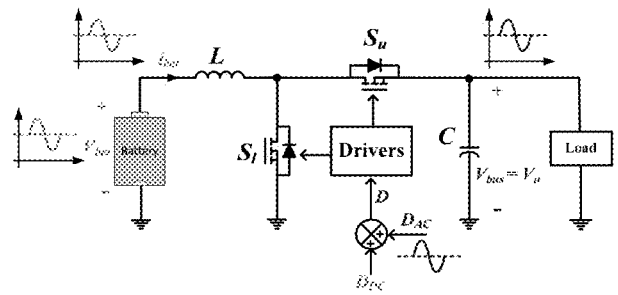
FIG. 5A is a diagram illustrating waveforms in a bidirectional DC-DC boost/buck power converter during a single-frequency online impedance measurement.

Each of the CPD, ESD, and PSD can be calculated using measurements of the AC ripple obtained over a single switching ripple cycle of the power converter, which is in contrast to the single frequency impedance measurement technique described with regard to FIG. 5A. Alternatively, each of the CPD, ESD, and PSD can optionally be calculated using measurements of the AC ripple obtained over a plurality of switching ripple cycles of the power converter. Alternatively or additionally, each of the CPD, ESD, and PSD can be calculated while the power converter is online delivering power to a load.

$$P(f_r) = V_{ac}(f_r) \cdot I_{ac}(f_r) \cdot e^{j[\theta_v(f_r) + \theta_i(f_r)]} \quad (3)$$

$$p_n = v_n \cdot i_n \quad (4)$$

$$P_k = \sum_{n=0}^{N-1} p_n \cdot e^{-j\left(\frac{2\pi k n}{N}\right)} = \sum_{n=0}^{N-1} p_n \cdot \left[\cos\left(-\frac{2\pi k n}{N}\right) + j\sin\left(-\frac{2\pi k n}{N}\right)\right]$$

Where N is the number of samples in the measured and sampled signal (e.g., the measured voltage or current of the battery), n is the current sample under consideration (0, 1, . . . , N−1), $p_n$ is the value of the signal at time n, k is the frequency under consideration (0 Hz to N−1 Hz), and $P_k$ is the value of the signal at frequency k which is a complex number that includes the amplitude and phase information of the signal at frequency k.

$$ESD_k = (\Delta t)^2 \left| \sum_{n=0}^{N-1} p_n \cdot e^{-j\left(\frac{2\pi kn}{N}\right)} \right|^2 \quad (5)$$

Where $\Delta t$ is the sampling interval.

$$PSD_k = \frac{(\Delta t)^2}{T} \left| \sum_{n=0}^{N-1} p_n \cdot e^{-j\left(\frac{2\pi kn}{N}\right)} \right|^2 \quad (6)$$

Where $T=N \cdot \Delta t$ based on a finite window $1 \leq n \leq N$.

Referring again to FIG. 1, the power converter 108 can optionally be operably coupled to a power converter controller 112, for example, using one or more communication links. It should be understood that the power converter controller 112 is configured to control operations of the power converter 108, e.g., maintains/regulates the DC value of the output voltage ($V_{o\text{-}reg}$), the load current ($I_{o\text{-}reg}$), load power, etc. Additionally, the controller 110 can optionally be operably coupled to the power converter controller 112, for example, using one or more communication links. As described above, a communication link may be implemented by any medium that facilitates data exchange including, but not limited to, wired, wireless and optical links.

Figure 4:
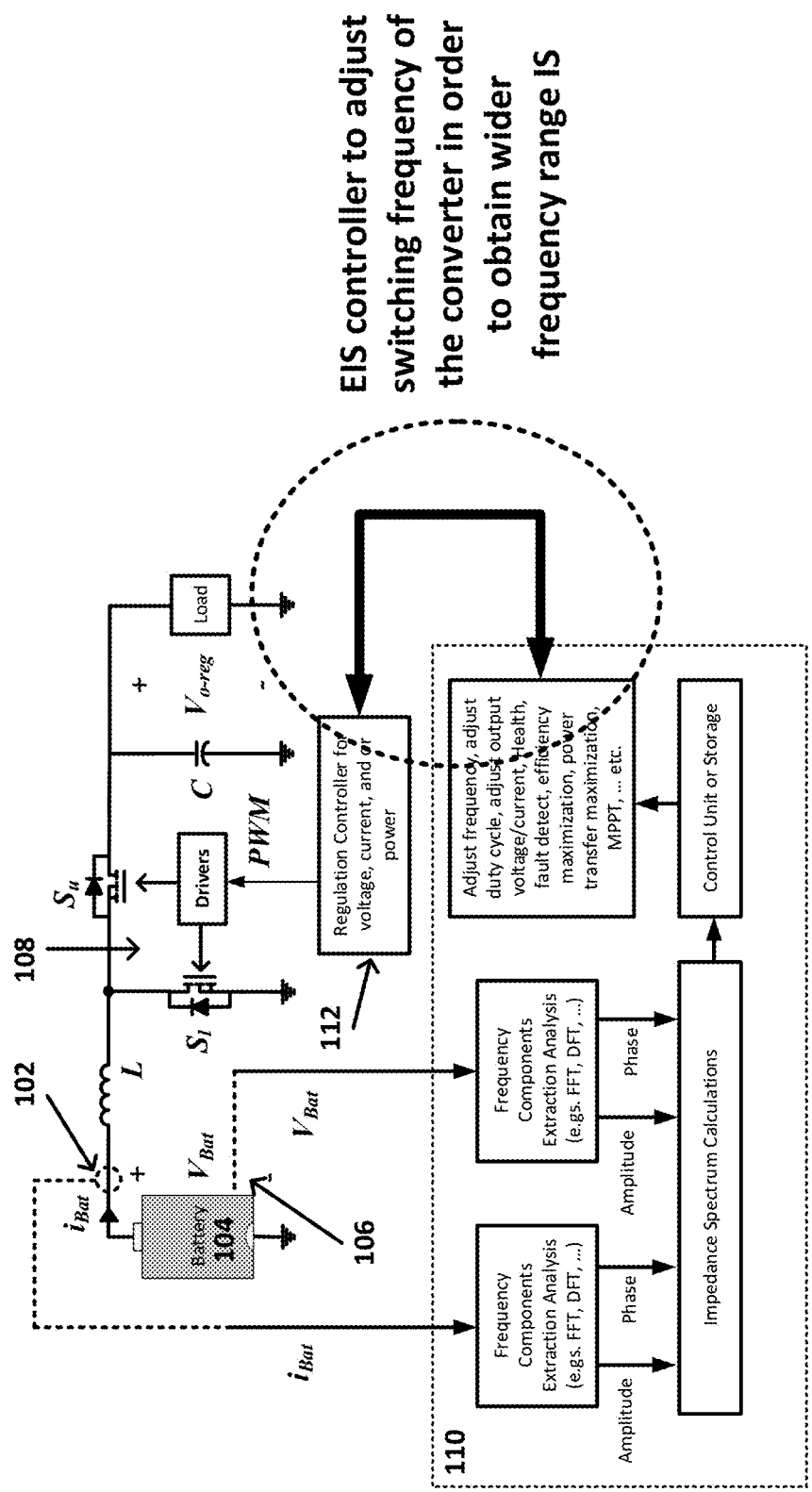
FIG. 4 illustrates an apparatus including a controller configured to adjust the switching frequency of a power converter in order to vary the switching ripple frequency.

Obtaining an Impedance Spectrum, Power Spectrum, or Spectral Density Having a Wider Frequency Range Varying the Switching Frequency of the Power Converter The impedance spectrum (IS), CPD, ESD, and/or PSD described above include values (i.e., complex magnitudes and phases) at a plurality of frequencies equal to or greater than a switching ripple frequency of the power converter. Using techniques described below, it is possible to obtain a wider range of measures and larger number of frequency versus impedance data points (i.e., higher data resolution). Referring now to FIG. 4, an apparatus including a controller configured to adjust the switching frequency of a power converter in order to vary the switching ripple frequency is shown. Using the apparatus of FIG. 4, it is possible to obtain an impedance spectrum, CPD, ESD, and/or PSD having a wider frequency range and higher data resolution. As shown in FIG. 4, a current sensor 102, an electrical component 104, a voltage sensor 106, a power converter 108, a controller 110, and a power converter controller 112 are shown. These elements are described in detail above with regard to FIG. 1 and are therefore not described in further detail below.

When the switching frequency of the power converter is set to 20 kHz (e.g., a first switching frequency), for example, the impedance spectrum, CPD, ESD, and/or PSD may be obtained for frequencies 20 kHz, 60 kHz, 100 kHz, 140 kHz, 180 kHz, . . . etc. (e.g., a plurality of frequencies including the fundamental frequency and harmonic frequencies related to the first switching frequency). Then, when the switching frequency of the power converter is set to 30 kHz (e.g., a second switching frequency), for example, the impedance spectrum, CPD, ESD, and/or PSD may be obtained for frequencies 30 kHz, 90 kHz, 150 kHz, 210 kHz, 270 kHz, . . . etc. (e.g., a plurality of frequencies including the fundamental frequency and harmonic frequencies related to the second switching frequency). The impedance spectrum, CPD, ESD, and/or PSD can be obtained, for example, using Equations (1)-(6) described above. Thus, by varying the switching frequency of the power converter, it is possible to obtain measurements having a wider frequency range. It should be understood that the first and second switching frequencies of 20 kHz and 30 kHz, respectively, are provided only as examples and that the first and second switching frequencies can have other values. Additionally, this disclosure contemplates using more than two different switching frequencies.

Closed-Loop Step-Function Perturbation of the Power Converter

Referring now to FIG. 5A, a diagram illustrating waveforms in a bidirectional DC-DC boost/buck power converter during a single-frequency online impedance measurement is shown. This impedance measurement technique is described in detail in U.S. Pat. No. 9,368,991, issued Jun. 14, 2016 to Jaber Abu Qahouq and entitled "Distributed battery power electronics architecture and control," the disclosure of which is incorporated herein by reference in its entirety. To obtain the impedance measurement, a small sinusoidal duty cycle perturbation signal ($D_{AC}$) is added to $D_{DC}$ as shown in FIG. 5A. The perturbation frequency is significantly lower (e.g., 10 or more times lower) than the switching frequency of the power converter. This small duty cycle perturbation results in generating relatively small sinusoidal ripples superimposed over the power converter DC output voltage. The duty cycle perturbation is performed for a single frequency at a time, i.e., it is not possible to obtain measurements for a plurality of frequencies in a single switching ripple cycle or a single sinusoidal perturbation cycle using this technique. Additionally, by adjusting the duty cycle of the power converter, control of the power converter is modified.

Figure 5B:
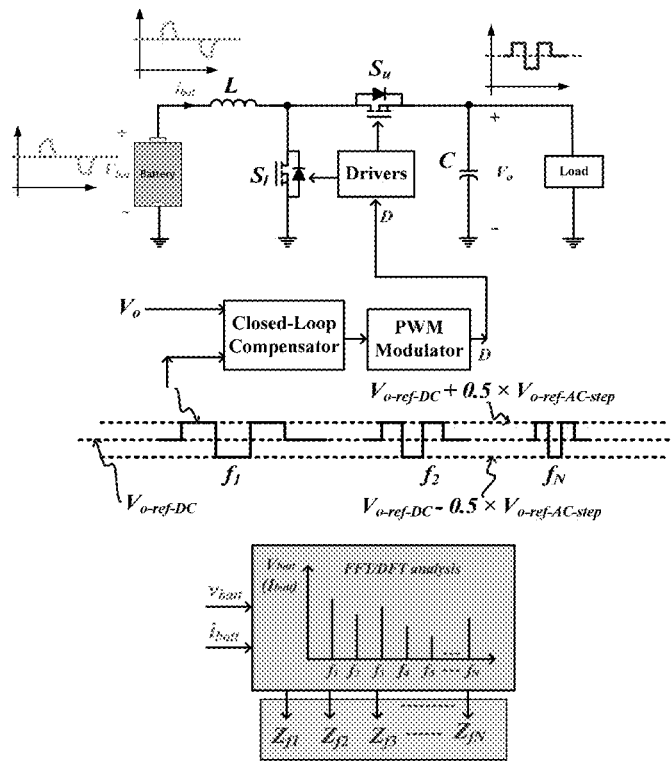
FIG. 5B is a diagram illustrating waveforms in a bidirectional DC-DC boost/buck power converter during a multi-frequency online impedance measurement using a step-function or step control signal perturbation.
Figure 6A:
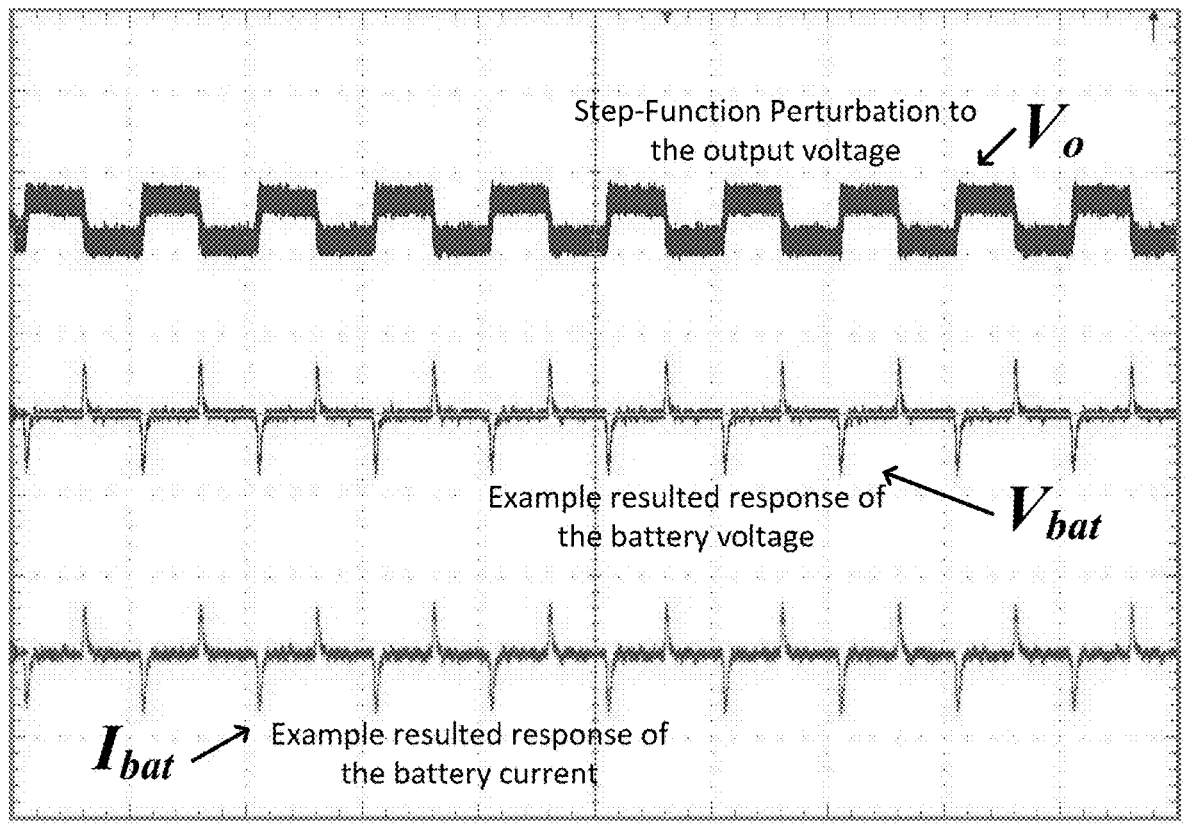
FIG. 6A includes an example set of waveforms illustrating possible AC coupled waveforms of a power converter output voltage ($V_o$), battery voltage ($V_{bat}$), and battery current ($I_{bat}$).
Figure 6B:
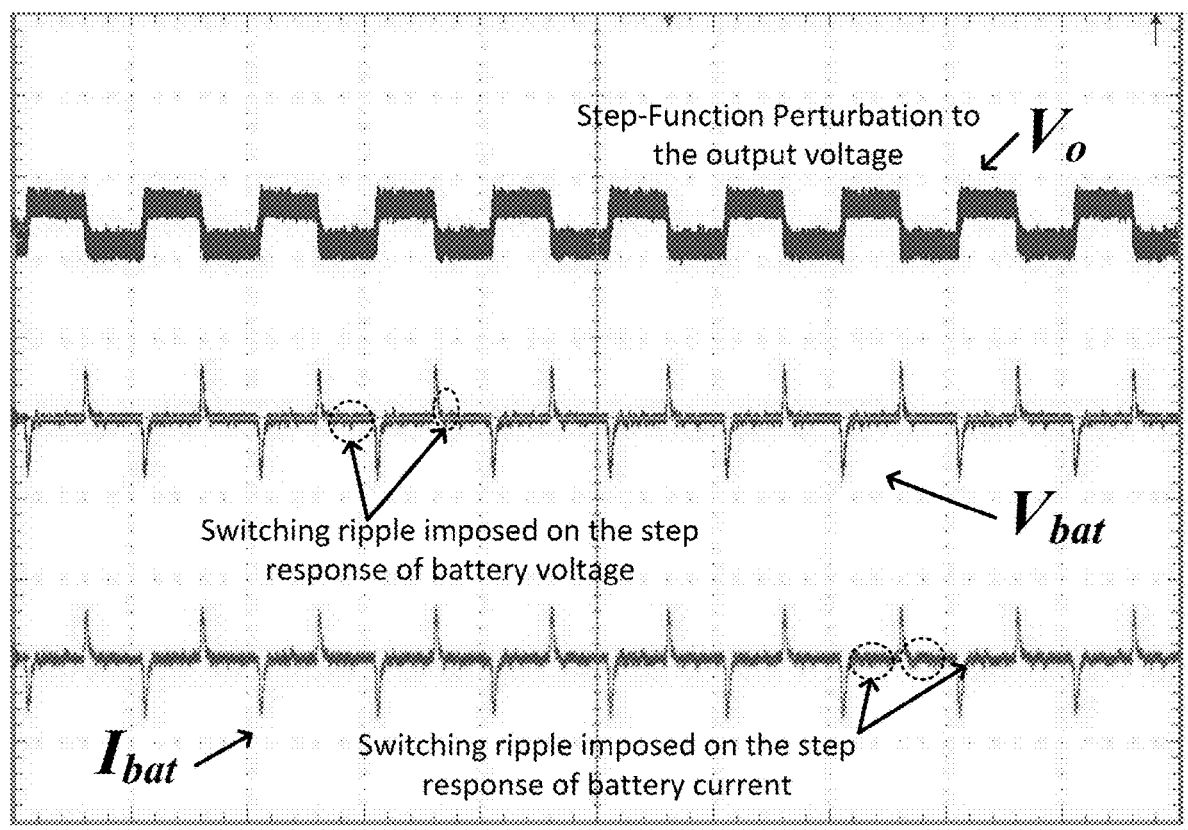
FIG. 6B includes an example set of waveforms illustrating that the switching ripple still exists when a step-function perturbation is active.
Figure 12:
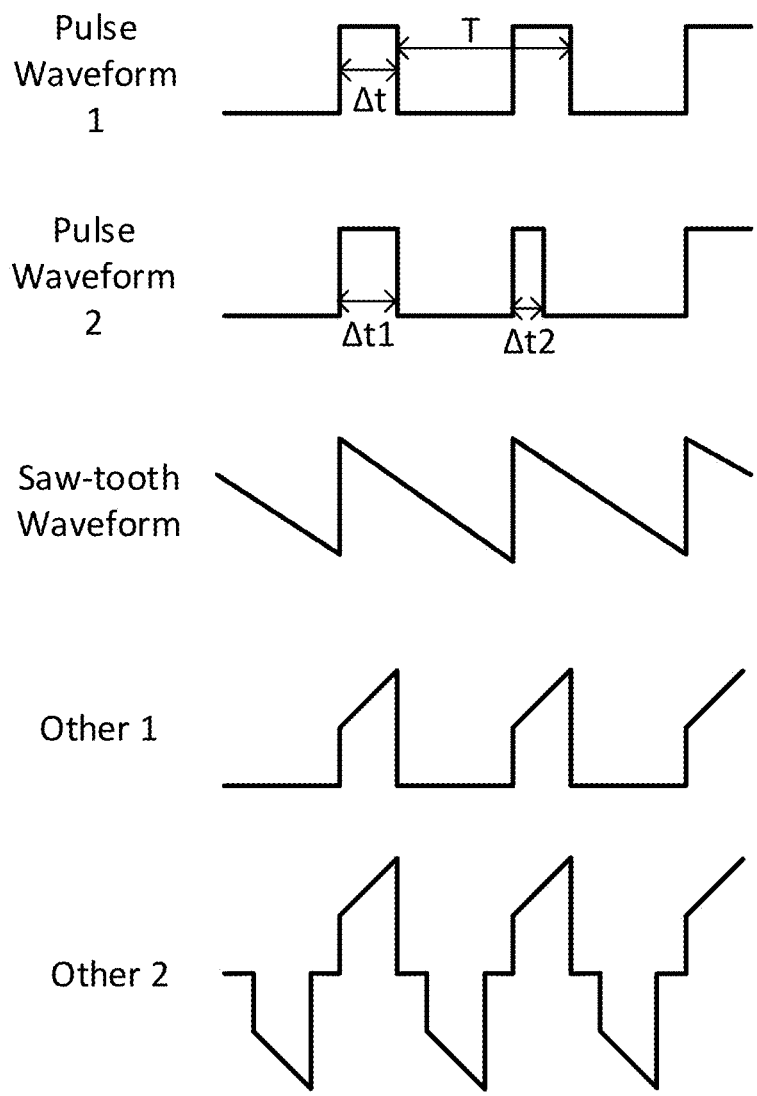
FIG. 12 is a diagram illustrating example perturbation waveforms according to implementations described herein.

Referring now to FIG. 5B, a diagram illustrating waveforms in a bidirectional DC-DC boost/buck power converter during a multi-frequency online impedance measurement is shown. This impedance measurement technique uses a closed-loop step-function perturbation of the output voltage or current of the power converter while maintaining the regulation of the DC value of the output voltage ($V_o$) of the power converter. The closed-loop step-function (e.g., a step control signal) can have square, semi square, pulse, saw-tooth, or non-square waveform shapes. For example, in some implementations, the step control signal can be a step pulse (e.g., a square or rectangular pulse). This disclosure contemplates that when the step control signal is a step pulse (square waveform shape), it will cause a response containing more frequency components. In other implementations, the step control signal can have other waveform shapes including, but not limited to, saw-tooth waveform shape. This disclosure contemplates that the perturbation waveforms (e.g., step-function, step control signal) can be of various types. The perturbation waveforms can be square waveforms or have other waveform shapes. Examples of other perturbation waveforms (other than square waveforms) are shown in FIG. 12. One of these perturbation waveforms is the pulse waveform with variable width ($\Delta t/T$). When the width is not equal to 0.5 (e.g., as shown in FIGS. 5B, 6A, 6B), both odd and even harmonics can be obtained, which yield to a spectrum with higher frequency resolution (i.e., harmonics at larger number of frequency point within the same spectrum range). In addition, $\Delta t$ can be varied adaptively (e.g., to vary the pulse width) in order to control at which frequencies the harmonics are stronger (i.e., have larger magnitude). This facilitates obtaining accurate measurement at certain harmonics when such harmonics are larger in magnitude. Optionally, an adaptive controller can adaptively switch between different types of perturbation waveforms with different magnitudes, widths, and/or frequencies in order to improve both accuracy and resolution, among others. An adaptive controller can also generate a perturbation waveform that is a result of adding, subtracting, multiplying, and/or dividing two or more waveforms and/or performing any other mathematical operation on one or more waveforms.

The step-function can be obtained by applying a step-function to the closed-loop controller's reference voltage that regulates the voltage, or by applying a step function to the closed-loop controller's reference current that regulates the current, or by applying a step-function to the duty-cycle directly, among others. For example, as shown in FIG. 5B, the closed-loop reference signal of the output voltage ($V_{o\text{-}ref}$) is stepped up and stepped down by a small change ($V_{o\text{-}ref\text{-}AC\text{-}step}$) around the DC value ($V_{o\text{-}ref\text{-}Dc}$) in order to generate a corresponding response by the battery voltage and the battery current, as given by Equation (7) and illustrated in FIG. 5B where $f_p$ is the perturbation frequency of the step function.

$$V_{o-ref}(t) = \begin{cases} V_{o-ref-DC} + 0.5 \times V_{o-ref-AC-step}, & 0 \le t \le 0.5/f_p \\ V_{o-ref-DC} - 0.5 \times V_{o-ref-AC-step}, & 0.5/f_p \le t \le 1/f_p \\ V_{o-ref-DC}, & \text{Otherwise} \end{cases} \quad (7)$$

For example, if the desired output voltage is $V_o$=8V, then the following values can be used in order to perturb the output voltage with a step-function: $V_{o\text{-}ref\text{-}DC}$=8V and $V_{o\text{-}ref\text{-}AC\text{-}step}$=0.2V. This will result in a response in the voltage and current of the battery. FIG. 6A includes an example set of waveforms illustrating possible AC coupled waveforms of a power converter output voltage ($V_O$), battery voltage ($V_{bat}$), and battery current ($I_{bat}$). FIG. 6B includes an example set of waveforms illustrating that the switching ripple still exists when a step-function perturbation is active. It should be understood that the desired output voltage and step-function described above are only provided as examples and can have other values. Additionally, the AC coupled waveforms are also provided only as examples and may take other forms. Further, while the example the step-function described in FIG. 5B is done for controlled output voltage, this disclosure contemplates that the step-function can also be done for controlled current. This disclosure also contemplates that the controlled voltage or current in which the step-function is applied to can be any voltage or current in the circuit or power converter and is not intended to be limited to the power converter output voltage or output current.

After perturbing the power converter output voltage or current with the step-function, the voltage and current associated with an electrical component (e.g., the battery in FIG. 5B) can be measured, for example, using voltage and current sensors (e.g., current sensor 102 and voltage sensor 106 of FIG. 1). The measured voltage and current can be sampled using an ADC. Then, using Equations (1)-(6), a frequency analysis to obtain respective frequency components of the response voltage and current can be performed, and the impedance spectrum, the power spectrum, or the power spectral density can be calculated based on the respective frequency components of the response voltage and current.

A closed-loop step-function perturbation cycle at a given frequency $f_p$ provides the values for the impedance spectrum, the power spectrum, or the power spectral density within a specific range of interest. The step-function fundamental/perturbation frequency $f_{p\text{-}step}$ is lower than the switching frequency of the converter (e.g., >10 times lower) and therefore the range of results will include $f_{p\text{-}step}$ and its higher harmonics which will cover the low frequency range (e.g., mostly lower than the switching ripple frequency ($f_{p\text{-}ripple}$)). For example, if there is an interest in obtaining measurements for frequencies around 500 Hz, $f_{p1}$=100 Hz can be selected in order to obtain the impedance spectrum, the power spectrum, or the spectral density for a frequency range of about 100 Hz through about 1.1 kHz for frequency points 100 Hz, 300 Hz, 500 Hz, 700 Hz, 900 Hz, and 1.1 kHz. Optionally, if this frequency resolution is not sufficient and additional points are needed within the range 100 Hz-1.1 kHz, another closed-loop step-function perturbation cycle can be used, for example $f_{p2}$=200 Hz. This $f_{p2}$=200 Hz together with $f_{p1}$=100 Hz will provide the impedance spectrum, the power spectrum, or the spectral density information for frequencies points 100 Hz, 200 Hz, 300 Hz, 500 Hz, 600 Hz, 700 Hz, 900 Hz, 1 kHz, and 1.1 kHz. Alternatively or additionally, if the desired frequency range is wider, then more closed-loop step-function perturbation cycles can be used. For example, if the impedance spectrum, the power spectrum, or the spectral density is desired for a frequency range of 10 Hz to 11 kHz, the following closed-loop step-function perturbation cycles can be used: $f_{p1}$=10 Hz, $f_{p2}$=100 Hz, $f_{p3}$=400 Hz, and $f_{p4}$=1 k Hz. Using the first ten or less frequencies in the spectrum for each $f_p$, the impedance spectrum, the power spectrum, or the spectral density is provided for 10 Hz, 30 Hz, 50 Hz, 70 Hz, 90 Hz, 100 Hz, 110 Hz, 130 Hz, 150 Hz, 170 Hz, 190 Hz, 300 Hz, 400 Hz, 500 Hz, 700 Hz, 900 Hz, 1 kHz, 1.1 kHz, 1.2 kHz, 2.8 kHz, 3 kHz, 3.6 kHz, 4.4 kHz, 5 kHz, 5.2 kHz, 6 kHz, 6.8 kHz, 7 kHz, 7.6 kHz, 9 kHz, and 11 kHz. It should be understood that the values of $f_{p1}$, $f_{p2}$, $f_{p3}$, and $f_{p4}$ are provided only as examples and that the number of closed-loop step-function perturbation cycles and/or values can be selected based on the desired frequency range and resolution.

It is possible to obtain low frequency (e.g., including frequencies less than the switching ripple frequency) measurements of impedance spectrum, power density, and/or spectral density using a closed-loop step-function perturbation, which does not involve introducing the small duty cycle perturbation described with respect to FIG. 5A, which is conducted at a single frequency at a time, as described herein.

Sinusoidal Perturbation

As described above, a small sinusoidal duty cycle perturbation signal ($D_{AC}$) can be added to $D_{DC}$, for example, as shown in FIG. 5A. The perturbation frequency is lower than the switching frequency of the power converter. The duty cycle fundamental/perturbation frequency $f_{p\text{-}duty\ cycle}$ is lower than the switching frequency of the converter (e.g., >10 times lower) and therefore the range of results will include $f_{p\text{-}duty\ cycle}$ and its higher harmonics which will cover the low frequency range (e.g., mostly lower than the switching ripple frequency ($f_{p\text{-}ripple}$)). This can be achieved by applying a duty cycle perturbation to the power converter (e.g., controlling the ON/OFF timing of switch(es) of the power converter). The small duty cycle perturbation results in generating relatively small sinusoidal ripples superimposed over the power converter DC output voltage, i.e., this causes a change in the AC ripple. The AC ripple can be measured, for example, using voltage and current sensors (e.g., current sensor 102 and voltage sensor 106 of FIG. 1). The measured voltage and current can be sampled using an ADC. Then, using Equations (1)-(6), a frequency analysis to obtain respective frequency components of the AC ripple can be performed, and the impedance spectrum, the power spectrum, or the spectral density can be calculated based on the respective frequency components of the AC ripple.

Figure 7:
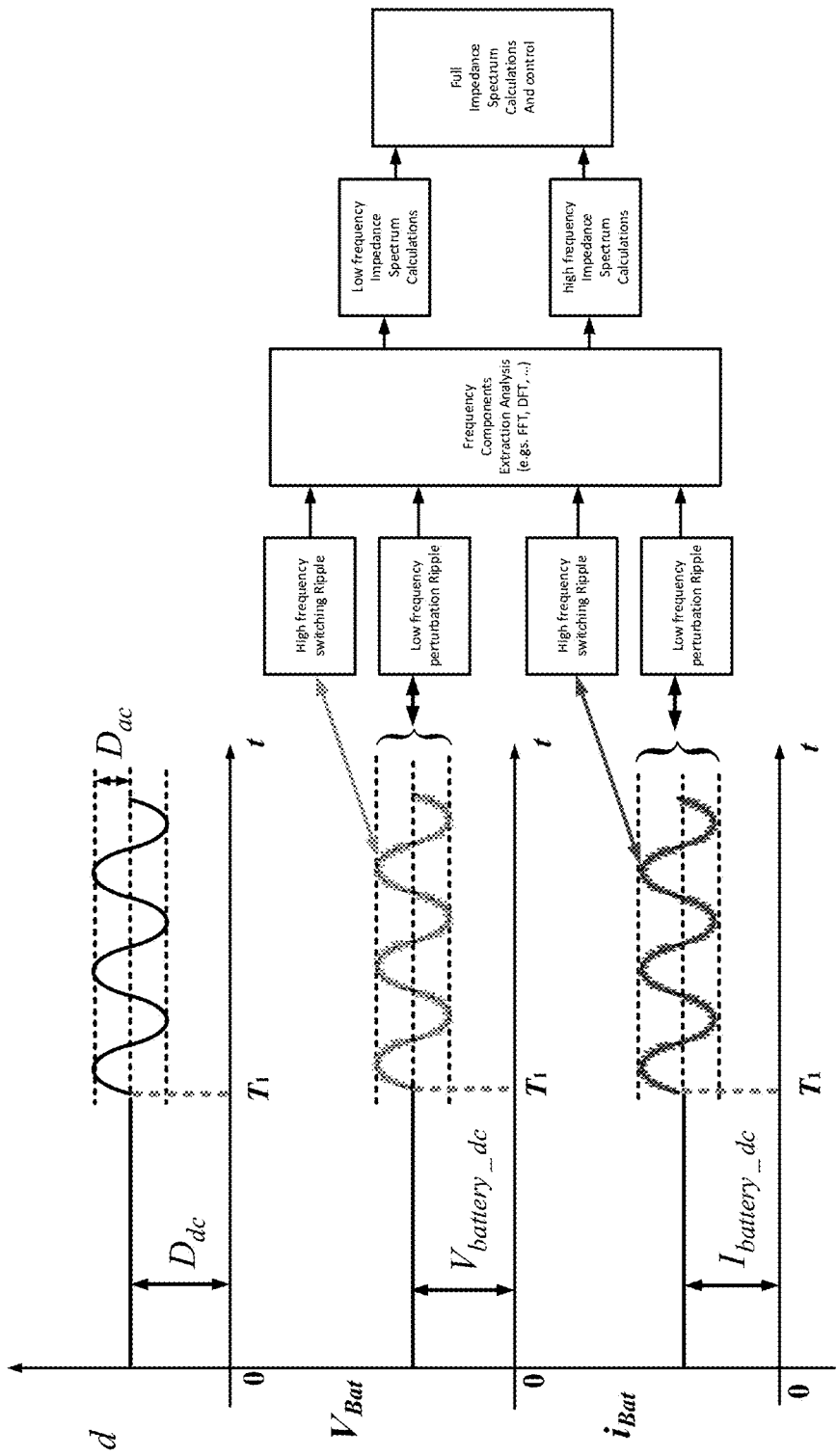
FIG. 7 is a diagram illustrating that the switching ripple still exists when a sinusoidal perturbation is active.

Referring now to FIG. 7, a diagram illustrating that switching ripple still exists when a sinusoidal perturbation is active. The AC ripple has two components—a low frequency perturbation ripple, which results from the duty cycle perturbation, and a high frequency switching ripple. The high frequency switching ripple is superimposed on the low frequency perturbation ripple. By performing the frequency analysis and calculations of Equations (1)-(6), the impedance spectrum, the power spectrum, or the spectral density can be obtained for frequencies both greater and less than the switching frequency of the power converter.

Obtaining an Impedance Spectrum, Power Spectrum, or Spectral Density for Frequencies Above and Below the Switching Ripple Frequency As described above, performing a frequency analysis (e.g., DFT, FFT) on the AC ripple of the power converter yields a plurality of frequency components. Thus, it is possible to obtain an impedance spectrum, power spectrum, or spectral density including values at a plurality of frequencies. These frequencies are related to the fundamental and harmonic frequencies of the switching frequency of the power converter and are therefore typically equal to or greater than the switching ripple frequency. Additionally, and as described above, a closed-loop step-function perturbation or a duty cycle perturbation can be used to obtain the impedance spectrum, power spectrum, or spectral density including values at a plurality of frequencies less than the switching ripple frequency. As shown in FIG. 6B, switching ripple still exists when step-function perturbations are active. The AC ripple has two components—a low frequency perturbation ripple, which results from the step-function perturbation, and a high frequency switching ripple. Additionally, as shown in FIG. 7, switching ripple is superimposed on the low frequency induced ripple resulting from the duty cycle perturbations. The AC ripple has two components—a low frequency perturbation ripple, which results from the duty cycle perturbation, and a high frequency switching ripple. Therefore, it is possible to obtain the impedance spectrum, power spectrum, or spectral density including values at frequencies both greater and less than the switching ripple frequency using techniques described herein in combination.

Switching Ripple Cancellation

The effects of the closed-loop step-function perturbation or the duty cycle perturbation on the AC ripple can be canceled by controlling the power converter simultaneously with one or more other power converters as described below. In some scenarios, a larger closed-loop step-function perturbation step size (e.g., larger $V_{o\text{-}ref\text{-}AC\text{-}step}$ in Equation (7)) may be desired for higher accuracy and/or lower hardware requirements such as ADC resolution and speed requirements. For example, while a closed-loop step-function perturbation step size $V_{o\text{-}ref\text{-}AC\text{-}step}$ in the range of 100 mV-200 mV or less may be sufficient, a 500 mV or larger step size can lead to more accurate results for a wider range at lower frequencies. However, the larger step size has the disadvantage of larger induced voltage ripple at the output of the power converter or the power supply bus.

To address this induced voltage ripple issue, a ripple cancellation technique can be used, which applies to a battery system with two or more battery cells.

Figure 8A:
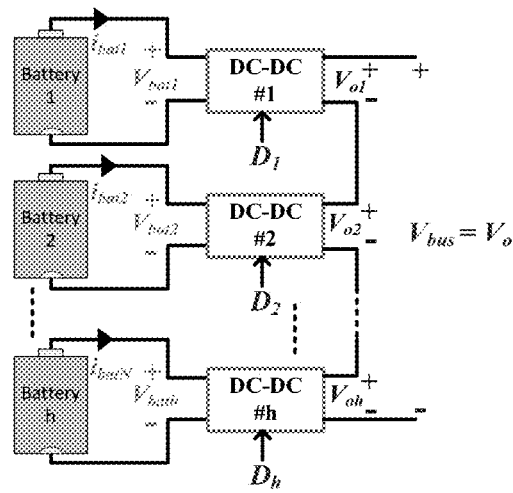
FIG. 8A illustrates a plurality of DC-DC power converters (e.g., DC-DC 1, DC-DC 2, . . . DC-DC h) with power converter outputs connected in series and a multi-battery input (e.g., Battery 1, Battery 2, . . . Battery h).
Figure 8B:
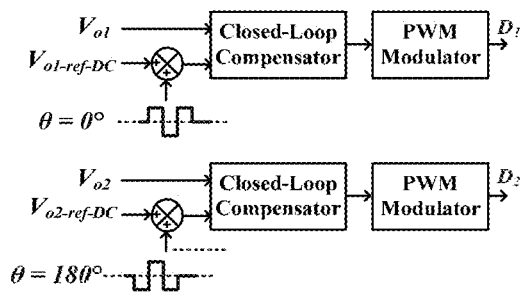
FIG. 8B is a block diagram illustrating an example controller for the system when two power converters are used for cancellation.
Figure 8C:
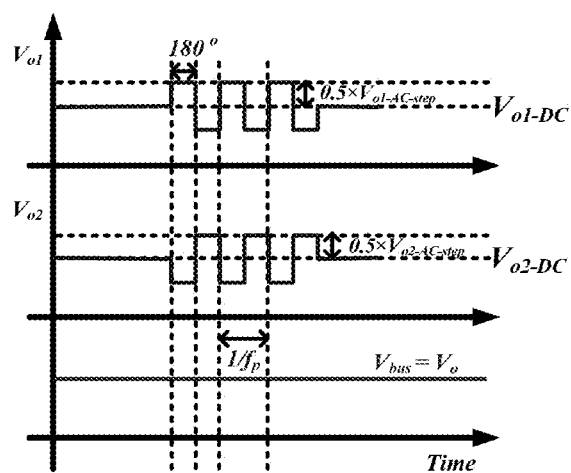
FIG. 8C is a graph illustrating example power converter waveforms when two power converters are used for cancellation.

Referring now to FIG. 8A, a plurality of DC-DC power converters (e.g., DC-DC 1, DC-DC 2, . . . DC-DC h) with power converter outputs connected in series and a multi-battery input (e.g., Battery 1, Battery 2, . . . Battery h) is shown. FIG. 8B is a block diagram illustrating an example controller for the system when two power converters are used for cancellation. FIG. 8C is a graph illustrating example power converter waveforms when two power converters are used for cancellation. As shown in FIG. 8A, by connecting two power converter outputs in series, where each power converter input has a power source (e.g., a battery) at its input, and by shifting $V_{o\text{-}ref\text{-}1}(t)$ of power converter 1 and $V_{o\text{-}ref\text{-}2}(t)$ of power converter 2 with respect to each other by 180° as shown in FIG. 8B, the total output voltage will become perturbation ripple free as a result of cancellation while performing impedance spectrum, power spectrum, and/or spectral density measurements for each of the batteries individually. An example ripple free total output voltage in such a case is shown in FIG. 8C.

Figure 9A:
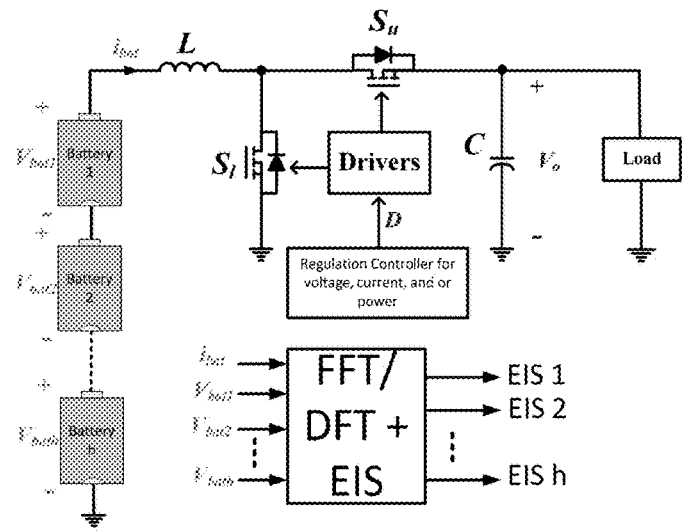
FIG. 9A is a diagram illustrating a plurality of power sources (e.g., batteries) connected in series at the input of a power converter.
Figure 9B:
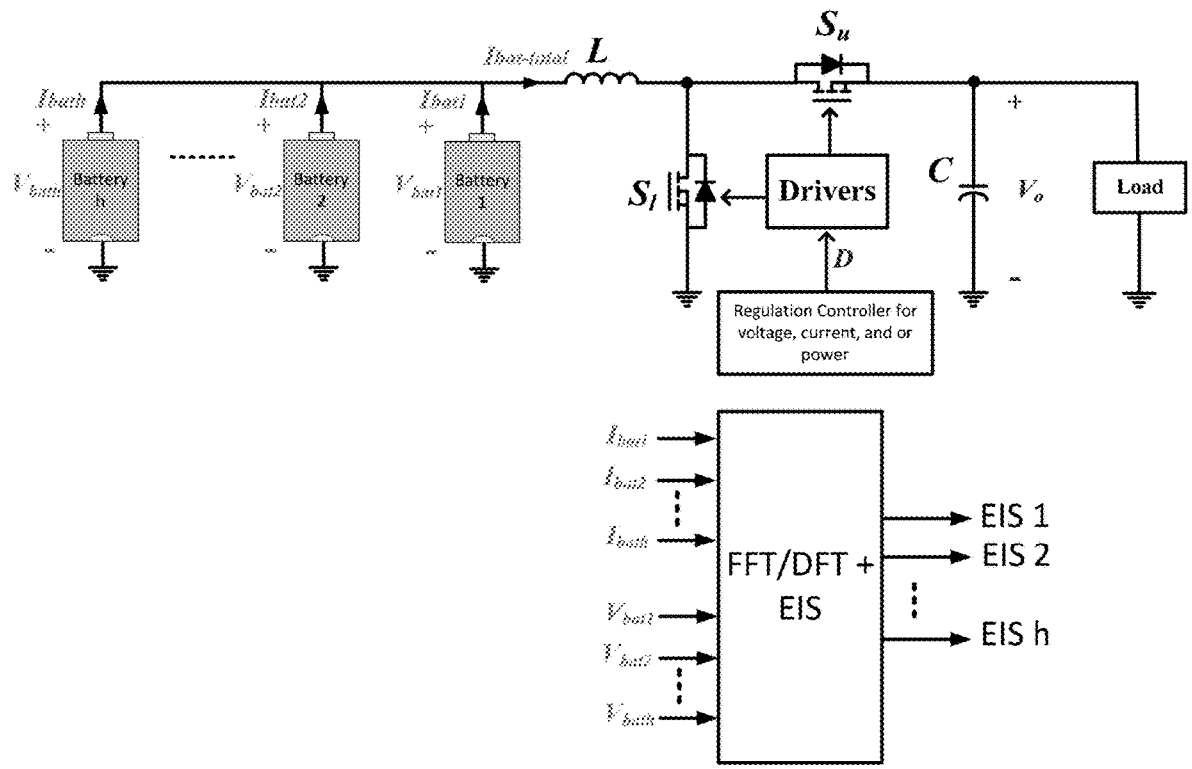
FIG. 9B is a diagram illustrating a plurality of power sources (e.g., batteries) connected in parallel at the input of a power converter.

If the system has even number of power converters (e.g., 2, 4, 6, . . . , etc. power converters), then each two $V_{o\text{-}ref}(t)$ for two of the power converters can be shifted by 180°. If the system has an odd number of power converters (e.g., 3, 5, 7, . . . , etc. power converters), then impedance spectrum, power spectrum, and/or spectral density measurements can be done for h−1 power converters at a time, where h is the total of power converters. This disclosure contemplates that phase shifts more or less than 180 can be used depending on the number of power converters used for cancelling the effects of the induced step-function or duty cycle perturbation ripple. The step-function or duty cycle magnitude/step size can also be made different for even or odd number of power converters to realize cancellation. In addition, it should be understood that two power converters can be used to achieve induced step-function or duty cycle perturbation ripple cancellation for a system with any number of batteries or battery cells, odd or even. For example, if the system has h=10 battery cells, five battery cells can be connected (e.g., in series or in parallel) at the input of each power converter. FIG. 9A is a diagram illustrating a plurality of power sources (e.g., batteries) connected in series at the input of a power converter. FIG. 9B is a diagram illustrating a plurality of power sources (e.g., batteries) connected in parallel at the input of a power converter. This disclosure contemplates that each of the power converter outputs can be connected in series as shown in FIG. 8A to achieve induced step-function perturbation or duty cycle ripple cancellation.

System with a Plurality of Electrical Components Connected to a Power Converter Input Referring again to FIGS. 9A and 9B, a plurality of electrical components can be connected in series and/or in parallel at the input of a power converter. In these implementations, the respective voltages and currents associated with each of the electrical components can be individually measured, and a respective impedance spectrum, power spectrum, or spectral density of each of the electrical components can be calculated. For example, FIG. 9A illustrates a plurality of batteries connected in series at the input of a power converter. The current (i.e., $i_{bat}$) flowing through each of the batteries is the same and can be measured with a current sensor, and the voltages (i.e., $V_{bat1}, V_{bat2}, \ldots V_{bath}$) across each of the batteries can be separately measured with a voltage sensor. FIG. 9B illustrates a plurality of batteries connected in parallel at the input of a power converter. The currents (i.e., $i_{bat1}, i_{bat2}, \ldots i_{bath}$) flowing through each of the batteries can be separately measured with a current sensor, and the voltage (i.e., $V_{bat}$) across each of the batteries is the same and can be measured with a voltage sensor. Thus, this disclosure contemplates that a frequency analysis can be performed on the respective current and voltage measured for each of the batteries using Equation (1). The respective impedance spectrum, power spectrum, and/or spectral density of each of the batteries can then be calculated, for example, using Equations (2)-(6).

It should be understood that closed-loop step-function perturbations and/or duty cycle perturbations can be used as described above for each of the batteries individually. When a plurality of electrical components (e.g., batteries) are connected in series, a closed-loop step-function perturbation of the power converter output voltage in an h-cell system results in h battery voltage responses and one battery current response (i.e., the current is the same for all cells that are connected in series). Therefore, in this scenario, there is a need to measure h+1 variables for an h cell battery system in order to obtain the individual impedance spectrum, power spectrum, and/or spectral density for each battery cell in the system. When a plurality of electrical components (e.g., batteries) are connected in parallel, a closed-loop step-function perturbation of the power converter output current in an h-cell system results in h battery current responses and one or h battery voltage response(s).

Using Impedance Spectrum, Power Spectrum, or Spectral Density

The impedance spectrum, the power or energy spectrum, or the spectral density can optionally be used to obtain a state of health (SOH) or state of charge (SOC) of the electrical component. It can also be used to obtain information that are of interest for many monitoring and control functions such as the minimum impedance point and its corresponding frequency, the frequency and the corresponding impedance value when the impedance angle/phase is zero, several points that indicate the model parameters of the battery, the slope of impedance change, the frequency when the power or energy spectrum or spectral density are mostly concentrated/maximum or are mostly weak/minimum, and the location of the closed-loop compensator poles and zeros that will result in the making the power or energy spectrum or spectral density concentrated/maximized at a frequency of interest such as the switching frequency of the power converter, among others. Alternatively or additionally, the power converter can be controlled based on the impedance spectrum, the power spectrum, or the power spectral density. For example, controlling the power converter can include at least one of adjusting a frequency, duty cycle, output voltage, or output current; performing fault detection; maximizing efficiency or power transfer; or performing maximum power point tracking. In some implementations, performing fault detection further can include detecting a fault in the electrical component based on a rate of change of the impedance spectrum, the power spectrum, or the power spectral density. In response to detecting the fault, the method can further include isolating the electrical component or providing an alarm.

Figure 10:
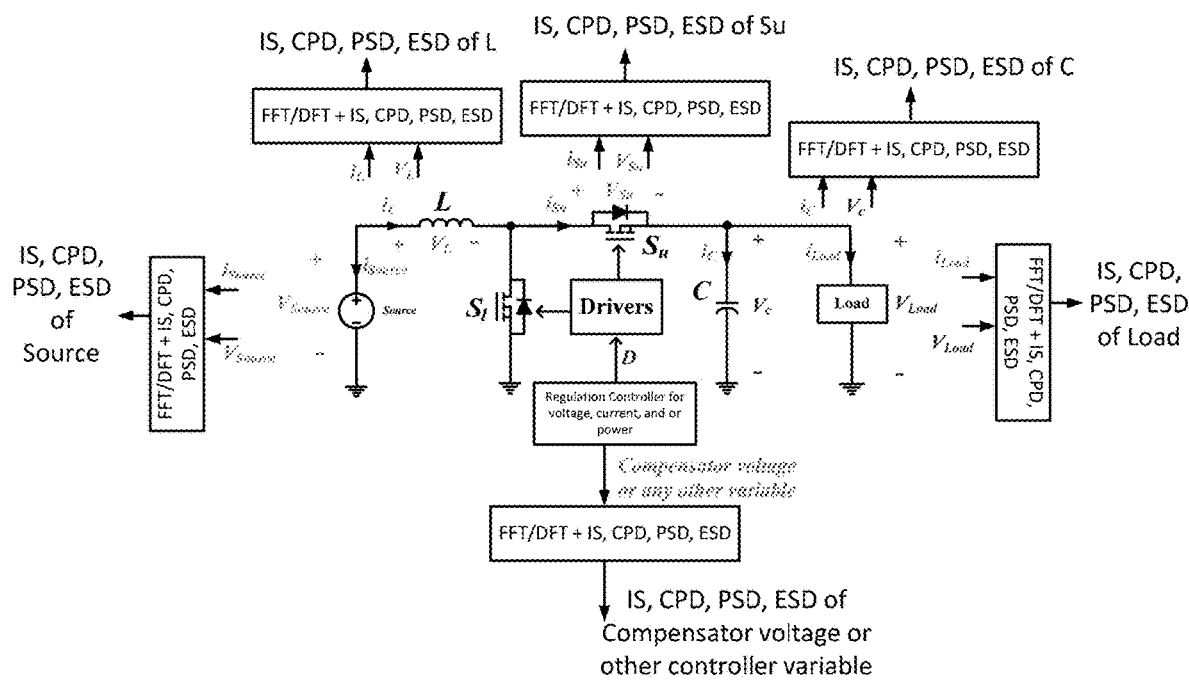
FIG. 10 is a block diagram illustrating a power converter where the techniques described herein are used to measure impedance spectrum, power density, power spectral density, and/or energy spectral density of electrical components other than batteries.

In many of the implementations described herein, the electrical component is a battery, which is used only as an example for the purposes of illustrating various techniques used to measure impedance spectrum, power density, power spectral density, and/or energy spectral density using frequency component analysis of power converter voltage and current ripple. This disclosure contemplates that the electrical component can be other electrical components including, but not limited to, a solar cell or panel, a fuel cell, a supercapacitor, a motor, a generator, an antenna, a wireless power coil, a piezoelectric energy harvester, an inductor, capacitor, transistor, diode, or transformer. Referring now to FIG. 10, a block diagram illustrating a power converter circuit where the techniques described herein are used to measure impedance spectrum, power density, power spectral density, and/or energy spectral density of electrical components other than batteries. A number of example measurements are provided below:

Impedance spectrum, power density, power spectral density, and/or energy spectral density for a capacitor or super capacitor that is placed anywhere in the power converter (e.g., input, output, middle, . . . etc.).

Impedance spectrum, power density, power spectral density, and/or energy spectral density for an inductor that is placed anywhere in the power converter (e.g., input, output, middle, . . . etc.).

Impedance spectrum, power density, power spectral density, and/or energy spectral density for a transistor that is placed anywhere in the power converter (e.g., input, output, middle, . . . etc.).

Impedance spectrum, power density, power spectral density, and/or energy spectral density for a diode that is placed anywhere in the power converter (e.g., input, output, middle, . . . etc.).

Impedance spectrum, power density, power spectral density, and/or energy spectral density for a load such as an light emitting diode (LED), motor, . . . etc.

Impedance spectrum, power density, power spectral density, and/or energy spectral density for one or more solar cells.

Impedance spectrum, power density, power spectral density, and/or energy spectral density for one or more fuel cells.

Impedance spectrum, power density, power spectral density, and/or energy spectral density for one or more of the controller parameters.

It should be understood that the above examples are not intended to be limiting and that the impedance spectrum, power density, power spectral density, and/or energy spectral density of other electrical components can be measured using the techniques described herein.

It should be appreciated that the logical operations described herein with respect to the various figures may be implemented (1) as a sequence of computer implemented acts or program modules (i.e., software) running on a computing device (e.g., the computing device described in FIG. 11), (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

Figure 11:
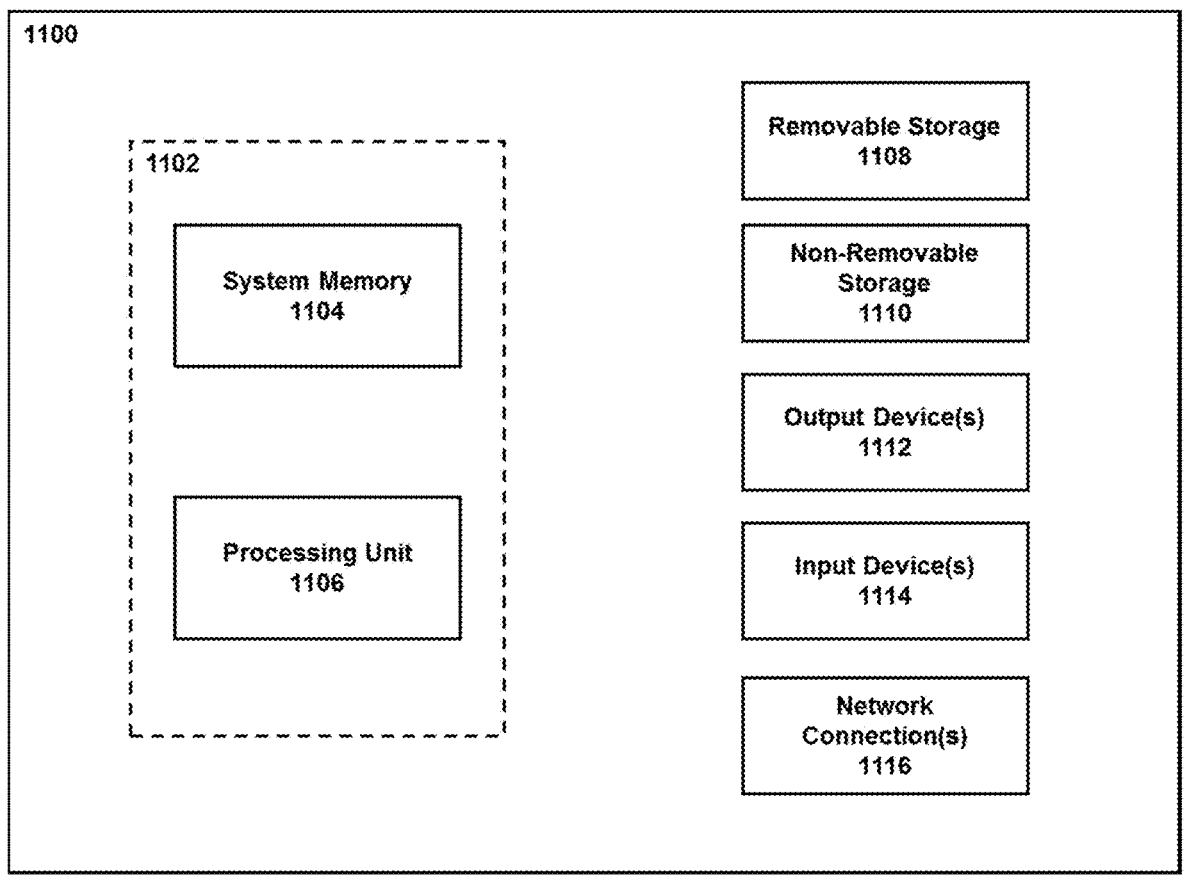
FIG. 11 is a block diagram of an example computing device.

Referring to FIG. 11, an example computing device 1100 upon which embodiments of the invention may be implemented is illustrated. It should be understood that the example computing device 1100 is only one example of a suitable computing environment upon which embodiments of the invention may be implemented. Optionally, the computing device 1100 can be a well-known computing system including, but not limited to, personal computers, servers, handheld or laptop devices, multiprocessor systems, microprocessor-based systems, network personal computers (PCs), minicomputers, mainframe computers, embedded systems, and/or distributed computing environments including a plurality of any of the above systems or devices. Distributed computing environments enable remote computing devices, which are connected to a communication network or other data transmission medium, to perform various tasks. In the distributed computing environment, the program modules, applications, and other data may be stored on local and/or remote computer storage media.

In its most basic configuration, computing device 1100 typically includes at least one processing unit 1106 and system memory 1104. Depending on the exact configuration and type of computing device, system memory 1104 may be volatile (such as random access memory (RAM)), non-volatile (such as read-only memory (ROM), flash memory, etc.), or some combination of the two. This most basic configuration is illustrated in FIG. 11 by dashed line 1102. The processing unit 1106 may be a standard programmable processor that performs arithmetic and logic operations necessary for operation of the computing device 1100. The computing device 1100 may also include a bus or other communication mechanism for communicating information among various components of the computing device 1100.

Computing device 1100 may have additional features/ functionality. For example, computing device 1100 may include additional storage such as removable storage 1108 and non-removable storage 1110 including, but not limited to, magnetic or optical disks or tapes. Computing device 1100 may also contain network connection(s) 1116 that allow the device to communicate with other devices. Computing device 1100 may also have input device(s) 1114 such as a keyboard, mouse, touch screen, etc. Output device(s) 1112 such as a display, speakers, printer, etc. may also be included. The additional devices may be connected to the bus in order to facilitate communication of data among the components of the computing device 1100. All these devices are well known in the art and need not be discussed at length here.

The processing unit 1106 may be configured to execute program code encoded in tangible, computer-readable media. Tangible, computer-readable media refers to any media that is capable of providing data that causes the computing device 1100 (i.e., a machine) to operate in a particular fashion. Various computer-readable media may be utilized to provide instructions to the processing unit 1106 for execution. Example tangible, computer-readable media may include, but is not limited to, volatile media, non-volatile media, removable media and non-removable media implemented in any method or technology for storage of information such as computer readable instructions, data structures, program modules or other data. System memory 1104, removable storage 1108, and non-removable storage 1110 are all examples of tangible, computer storage media. Example tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In an example implementation, the processing unit 1106 may execute program code stored in the system memory 1104. For example, the bus may carry data to the system memory 1104, from which the processing unit 1106 receives and executes instructions. The data received by the system memory 1104 may optionally be stored on the removable storage 1108 or the non-removable storage 1110 before or after execution by the processing unit 1106.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method for measuring impedance spectrum, power spectrum, or spectral density, comprising:
    applying, using a power converter, a perturbation signal;
    varying a switching frequency of the power converter;
    measuring an alternating current (AC) ripple associated with the power converter, wherein the AC ripple comprises an AC current ripple and an AC voltage ripple, the AC ripple having a switching ripple frequency;
    performing a frequency analysis to obtain respective frequency components of the AC current ripple and the AC voltage ripple; and
    calculating an impedance spectrum, a power spectrum, or a spectral density of an electrical component based on the respective frequency components of the AC current ripple and the AC voltage ripple, wherein the AC ripple further comprises a low frequency component associated with the perturbation signal and a high frequency component associated with the switching frequency of the power converter, wherein the impedance spectrum, the power spectrum, or the spectral density of the electrical component includes respective values at a plurality of different frequencies, the different frequencies including frequencies less than the switching ripple frequency and frequencies greater than the switching ripple frequency, and wherein the frequencies less than the switching ripple frequency are associated with the perturbation signal and the frequencies greater than the switching ripple frequency are associated with the switching frequency of the power converter.

2. The method of claim 1, wherein the impedance spectrum, the power spectrum, or the spectral density is calculated while the power converter is online delivering power to a load.

3. The method of claim 1, wherein measuring the AC ripple comprises measuring respective voltages and currents associated with a plurality of electrical components, the method further comprising calculating a respective impedance spectrum, power spectrum, or spectral density of each of the electrical components.

4. The method of claim 3, wherein the electrical components are connected in series or in parallel with each other.

5. An apparatus for measuring impedance spectrum, power spectrum, or spectral density, comprising:
    a current sensor configured for measuring current flowing through an electrical component;
    a voltage sensor configured for measuring voltage across the electrical component, wherein the measured current and voltage comprise an alternating current (AC) ripple associated with a power converter, the AC ripple comprising an AC current ripple and an AC voltage ripple;
    a controller operably coupled to the current sensor and the voltage sensor; and
    a power converter controller operably connected to the controller, wherein the power converter controller is configured to vary the switching frequency of the power converter, the controller comprising a processing unit and a memory operably coupled to the processing unit, the memory having computer-executable instructions stored thereon that, when executed by the processing unit, cause the processing unit to:
    control the power converter to apply a perturbation signal,
    receive and sample the current and voltage measured by the current and voltage sensors,
    perform a frequency analysis on the sampled current and voltage to obtain respective frequency components of the AC current ripple and the AC voltage ripple, the AC ripple having a switching ripple frequency, and
    calculate an impedance spectrum, a power spectrum, or a spectral density of the electrical component based on the respective frequency components of the AC current ripple and the AC voltage ripple, wherein the AC ripple further comprises a low frequency component associated with the perturbation signal and a high frequency component associated with the switching frequency of the power converter, wherein the impedance spectrum, the power spectrum, or the spectral density of the electrical component includes respective values at a plurality of different frequencies, the different frequencies including frequencies less than the switching ripple frequency and frequencies greater than the switching ripple frequency, and wherein the frequencies less than the switching ripple frequency are associated with the perturbation signal and the frequencies greater than the switching ripple frequency are associated with the switching frequency of the power converter.

6. The apparatus of claim 5, wherein the impedance spectrum, the power spectrum, or the spectral density is calculated using measurements of the AC ripple obtained over a single switching ripple cycle of the power converter.

7. The apparatus of claim 5, wherein performing the frequency analysis comprises using a Fast Fourier Transform (FFT) or a Discrete Fourier Transform (DFT).

8. The apparatus of claim 5, wherein the electrical component comprises a power source or load.

9. The apparatus of claim 5, wherein the electrical component is a component of the power converter.

10. The apparatus of claim 5, wherein the impedance spectrum, the power spectrum, or the spectral density is calculated based on respective frequency components of the AC current ripple and the AC voltage ripple at a first switching frequency and respective frequency components of the AC current ripple and the AC voltage ripple at a second switching frequency.

11. The apparatus of claim 5, wherein the power converter controller is configured to apply the perturbation signal, wherein the perturbation signal is a step-function perturbation configured to increase an output voltage or current of the power converter, and wherein the memory has further computer-executable instructions stored thereon that, when executed by the processing unit, cause the processing unit to:
    measure voltage and current associated with the electrical component in response to the step-function perturbation; and
    perform a frequency analysis to obtain respective frequency components of the response voltage and current associated with the electrical component, wherein the impedance spectrum, the power spectrum, or the spectral density is further calculated based on the respective frequency components of the response voltage and current associated with the electrical component.

12. The apparatus of claim 11, wherein the step-function perturbation has a square, semi square, pulse, saw-tooth, or non-square waveform shape.

13. The apparatus of claim 5, wherein the power converter controller is configured to apply the perturbation signal, wherein the perturbation signal is a duty cycle perturbation to the power converter, and wherein the memory has further computer-executable instructions stored thereon that, when executed by the processing unit, cause the processing unit to:
    measure voltage and current associated with the electrical component in response to the duty cycle perturbation; and
    perform a frequency analysis to obtain respective frequency components of the response voltage and current associated with the electrical component, wherein the impedance spectrum, the power spectrum, or the spectral density is further calculated based on the respective frequency components of the response voltage and current associated with the electrical component.

14. The apparatus of claim 5, wherein the power converter controller is configured to control the power converter based on the impedance spectrum, the power spectrum, or the spectral density.

15. The apparatus of claim 14, wherein controlling the power converter comprises at least one of adjusting a frequency, duty cycle, output voltage, or output current; performing fault detection; maximizing efficiency or power transfer; or performing maximum power point tracking.

16. The apparatus of claim 5, wherein the memory has further computer-executable instructions stored thereon that, when executed by the processing unit, cause the processing unit to use the impedance spectrum, the power spectrum, or the spectral density to obtain a state of health (SOH) or state of charge (SOC) of the electrical component.

17. The apparatus of claim 16, wherein the electrical component is a transistor, capacitor, or inductor.

18. A system for measuring impedance spectrum, power spectrum, or spectral density, comprising:
    a power converter electrically connected between a power source and a load;

an electrical component operably connected with the power converter;

a current sensor configured for measuring current flowing through the electrical component;

a voltage sensor configured for measuring voltage across the electrical component, wherein the measured current and voltage comprise an alternating current (AC) ripple associated with the power converter, the AC ripple comprising an AC current ripple and an AC voltage ripple; and a controller operably coupled to the current sensor and the voltage sensor, the controller comprising a processing unit and a memory operably coupled to the processing unit, the memory having computer-executable instructions stored thereon that, when executed by the processing unit, cause the processing unit to:

control the power converter to a apply perturbation signal, vary a switching frequency of the power converter, receive and sample the current and voltage measured by the current and voltage sensors, perform a frequency analysis on the current and voltage to obtain respective frequency components of the AC current ripple and the AC voltage ripple, the AC ripple having a switching ripple frequency, and calculate an impedance spectrum, a power spectrum, or a spectral density of the electrical component based on the respective frequency components of the AC current ripple and the AC voltage ripple, wherein the AC ripple further comprises a low frequency component associated with the perturbation signal and a high frequency component associated with the switching frequency of the power converter, wherein the impedance spectrum, the power spectrum, or the spectral density of the electrical component includes respective values at a plurality of different frequencies, the different frequencies including frequencies less than the switching ripple frequency and frequencies greater than the switching ripple frequency, and wherein the frequencies less than the switching ripple frequency are associated with the perturbation signal and the frequencies greater than the switching ripple frequency are associated with the switching frequency of the power converter.

* * * * *